United States Patent
Nicholas et al.

(10) Patent No.: US 12,022,610 B2
(45) Date of Patent: Jun. 25, 2024

(54) CONTROLLED WETTING AND SPREADING OF METALS ON SUBSTRATES USING POROUS INTERLAYERS AND RELATED ARTICLES

(71) Applicant: BOARD OF TRUSTEES OF MICHIGAN STATE UNIVERSITY, East Lansing, MI (US)

(72) Inventors: Jason Dale Nicholas, Okemos, MI (US); Quan Zhou, Farmington Hills, MI (US); Thomas Rector Bieler, East Lansing, MI (US)

(73) Assignee: BOARD OF TRUSTEES OF MICHIGAN STATE UNIVERSITY, East Lansing, MI (US)

( * ) Notice: Subject to any disclaimer, the term of this patent is extended or adjusted under 35 U.S.C. 154(b) by 0 days.

(21) Appl. No.: 17/668,660

(22) Filed: Feb. 10, 2022

(65) Prior Publication Data

US 2022/0167501 A1 May 26, 2022

Related U.S. Application Data

(62) Division of application No. 16/386,576, filed on Apr. 17, 2019, now Pat. No. 11,284,510.

(Continued)

(51) Int. Cl.
*H05K 1/03* (2006.01)
*H05K 3/12* (2006.01)
(Continued)

(52) U.S. Cl.
CPC ......... *H05K 1/0306* (2013.01); *H05K 3/1208* (2013.01); *H05K 3/22* (2013.01); *H05K 3/3478* (2013.01)

(58) Field of Classification Search
CPC .................................................. H05K 1/0306
(Continued)

(56) References Cited

U.S. PATENT DOCUMENTS 3,907,621 A * 9/1975 Polichette ........... C23C 18/2086
216/17
4,659,587 A 4/1987 Imura et al.
(Continued)

FOREIGN PATENT DOCUMENTS

JP         2537653 B2    9/1996
WO    WO 03/032084    *  4/2003
(Continued)

OTHER PUBLICATIONS

Nicholas et al., "Advanced Brazing for Joining and Circuit Applications," presented Michigan State University Innovation Celebration, Apr. 19, 2018.
(Continued)

*Primary Examiner* — Stanley Tso
(74) *Attorney, Agent, or Firm* — MARSHALL, GERSTEIN & BORUN LLP

(57) ABSTRACT

The disclosure generally relates to a method of creating patterned metallic circuits (e.g., silver circuits) on a substrate (e.g., a ceramic substrate). A porous metal interlayer (e.g., porous nickel) is applied to the substrate to improve wetting and adhesion of the patterned metal circuit material to the substrate. The substrate is heated to a temperature sufficient to melt the patterned metal circuit material but not the porous metal interlayer. Spreading of molten metal circuit material on the substrate is controlled by the porous metal interlayer, which can itself be patterned, such as having a defined circuit pattern. Thick-film silver or other metal circuits can be custom designed in complicated shapes for high temperature/high power applications. The materials (Continued)

designated for the circuit design allows for a low-cost method of generating silver circuits other metal circuits on a ceramic substrate.

20 Claims, 6 Drawing Sheets

Related U.S. Application Data

(60) Provisional application No. 62/658,659, filed on Apr. 17, 2018.

(51) Int. Cl.
*H05K 3/22* (2006.01)
*H05K 3/34* (2006.01)

(58) Field of Classification Search
USPC .......................................................... 29/851
See application file for complete search history.

(56) References Cited

U.S. PATENT DOCUMENTS

| | | | |
|---|---|---|---|
| 4,793,968 A | 12/1988 | Mosser et al. | |
| 5,163,499 A | 11/1992 | Newkirk et al. | |
| 5,780,163 A | 7/1998 | Camilletti et al. | |
| 6,270,601 B1 | 8/2001 | Ritland et al. | |
| 6,319,387 B1* | 11/2001 | Krishnamoorthy | H01L 21/2885 205/240 |
| 6,800,360 B2 | 10/2004 | Miyanaga et al. | |
| 6,951,682 B1 | 10/2005 | Zebala | |
| 10,487,404 B2 | 11/2019 | Liu et al. | |
| 2004/0166340 A1 | 8/2004 | Cairns et al. | |
| 2011/0076390 A1 | 3/2011 | Cerio, Jr. et al. | |
| 2013/0270581 A1* | 10/2013 | Lowes | H01L 25/0753 257/88 |
| 2014/0170529 A1* | 6/2014 | Jain | H01M 8/0236 252/518.1 |
| 2015/0290771 A1* | 10/2015 | Li | B24D 3/06 51/297 |
| 2016/0326623 A1* | 11/2016 | Nagayama | C23C 4/134 |
| 2016/0366760 A1* | 12/2016 | Lee | H05K 1/0283 |
| 2018/0326524 A1 | 11/2018 | Nicholas et al. | |
| 2019/0320528 A1 | 10/2019 | Nicholas et al. | |

FOREIGN PATENT DOCUMENTS

| | | |
|---|---|---|
| WO | WO-03/032084 A2 | 4/2003 |
| WO | WO-03/035279 A1 | 5/2003 |

OTHER PUBLICATIONS

Zhou et al., "Reactive-Element-Free, Silver-Based Brazes for SOFC Applications," presented at Michigan State University CHEMS Forum, May 11, 2017.

Zhou, "New Braze Material for Planar Solid Oxide Fuel Cell Applications," Michigan State University Ph.D. dissertation (2019).

Zhou et al., "Transient Porous Nickel Interlayers for Improved Silver-Based Solid Oxide Fuel Cell Brazes," *Acta Materialia* 148 (2018), pp. 156-162, available online Feb. 3, 2018.

\* cited by examiner

CONTROLLED WETTING AND SPREADING OF METALS ON SUBSTRATES USING POROUS INTERLAYERS AND RELATED ARTICLES

CROSS-REFERENCE TO RELATED APPLICATIONS

This application is a division of U.S. patent application Ser. No. 16/386,576, filed Apr. 17, 2019, which claims the benefit of U.S. Provisional Patent Application Na 62/658,659, filed Apr. 17, 2018, the entire disclosures of which are incorporated herein by reference.

STATEMENT OF GOVERNMENT INTEREST

This invention was made with government support under DE-FE0031250 awarded by the U.S. Department of Energy. The government has certain rights in the invention.

BACKGROUND OF THE DISCLOSURE

Field of the Disclosure

The disclosure relates to method for controlled wetting and spreading of metals on substrates, in particular where the substrates are difficult to wet with molten metal, such as in the case of ceramic substrates. The method includes formation of a porous first metal layer on a substrate to assist wetting of the substrate with a molten second metal, which in turn can form a patterned second metal layer adhered to the substrate. The resulting article including the patterned second metal layer on the substrate can be used, for example, in high-temperature and/or high-amperage electronic devices.

Background

Ceramic materials are of growing interest to multiple industries for their superior mechanical, thermal, and electrical properties. For example, ceramic materials are widely used in devices such as solid oxide fuel cells (SOFCs), high-power electronics, cutting tools, and ceramic circuit boards. However, practical applications of these ceramic materials often requires them to be joined with another material, such as a metal, to utilize their high thermal conductivity and low thermal expansion.

High amperage devices require thermally stable materials and unique circuit designs to facilitate the demands of current collectors, interconnects, or fuel cells. Often, screen printing is used at an industrial level to generate printed circuit boards (PCBs) that can accomplish these tasks. Ceramic PCBs are desired due to their ability to handle high temperature, high frequency, and high pressure environments with great reliability. FIG. 1 illustrates PCBs on a ceramic substrate (left) and a conventional substrate (right).

Ceramic substrates such as alumina, aluminum nitride, or beryllium oxide are highly thermally conductive and can dissipate heat quickly across a surface, preventing heat build-up and improving the life of semiconductor junctions on the PCB. Therefore, ceramic substrates are ideal for high amperage and high temperature devices. Nickel is often used in industry as a connector for the screen printing process and bridges the gap between circuit material and ceramic substrate.

Many large scale producers of PCBs utilize circuit paste as a material to connect surface-mounted components to pads on the board. Circuit paste is distributed in a sticky-viscous form and is solidified under large amounts of heat to generate a mechanical connection. However, methods of application for circuit paste often introduce defects in the connection. Defects such as too much solder, or solder bridging can occur, and such defects can be exasperated by high-temperature environments.

Reactive wetting is a method for improving wetting of metals on ceramic substrates. In reactive wetting, the addition of reactive elements such as Si, Ti, Zr, and Ge are introduced to the liquid metal to assist in the dissolution of the ceramic substrate and/or formation of new reaction compound(s) at the ceramic/liquid metal interface. However, this process generally requires a protective atmosphere, and most commonly high vacuum, for the chemical stability of these added reactive elements, making this method costlier and not viable for industrial applications. An alternative route for reactive wetting is to achieve a reactive surface layer on the ceramic substrate rather than incorporating reactive elements into the liquid metal. This process, however, is usually performed using a number of surface coating steps and thus has higher costs.

Therefore an alternative for ceramic substrate PCBs is needed.

SUMMARY

In one aspect, the disclosure relates to a method for forming a patterned metal layer on a substrate, the method comprising: (a) providing a porous wetting substrate comprising: (i) an underlying substrate, and (ii) a porous first metal layer on a surface of the underlying substrate; (b) applying (or contacting) a patterned second metal material to the porous wetting substrate and in contact with the porous first metal layer thereon, the second metal having a lower melting point than that of the first metal; and (c) heating the second metal (e.g., in a protective or inert atmosphere) at a temperature and pressure sufficient to melt the second metal material, wet pores of the porous first metal layer with the molten second metal material, and contact the underlying substrate with the molten second metal material, thereby forming a wetted substrate comprising the underlying substrate, and a patterned, wetted second metal layer adhered to the underlying substrate (e.g., via the porous first metal layer). In part (a), the porous first metal layer is suitably adhered to the underlying substrate, such as resulting from a pre-sintering process or otherwise. Suitably, the second metal melting point is at least 25, 50, 100, 200, or 300° C. and/or up to 300, 500, 700 or 1000° C. lower than the first metal melting point. Similarly, the second metal melting point is suitably lower than the melting or thermal decomposition points of the underlying substrate. In part (c), the heating temperature is suitably sufficiently high to melt the second metal material, but far enough below the melting point of the first metal such that the porous first metal layer does not melt or otherwise disintegrate before its porous structure promotes the wetting and contact of the substrate with the molten second metal material. The final, solid patterned second metal layer forms after cooling of the wetted substrate (e.g., with the second metal material still in liquid form), for example returning to ambient temperature and pressure conditions without elevated heating temperatures and/or an inert protective atmosphere. The patterned second metal layer generally can include at least one or two portions: a bulk second metal layer and optionally an interfacial layer between the bulk second metal layer and the substrate.

In another aspect, the disclosure relates to a method for forming an electronic apparatus or component, the method comprising: (a) performing the above method in and of its variously disclosed embodiments to form the wetted substrate comprising the underlying substrate, and a patterned, wetted second metal layer adhered to the underlying substrate, wherein the patterned second metal material has a spatial pattern corresponding to electronic circuitry; and (b) mounting one or more electronic components (e.g., processor, memory) to the wetted substrate in electrical connection to an element of the patterned, wetted second metal layer. The electronic components also can be interconnected with each other via one or more second metal pattern elements. The electronic components and/or integrated electronic systems suitable for manufacture and use as a high-temperature PCB are not particularly limited. Examples include industries that need higher-frequency connections and good heat resistance that can benefit from ceramic PCBs, for example including automotive components, aerospace components, medical device components, heavy machinery components, monitors for drilling equipment and related components, sensors in heat engines of any kind, RF resistors and terminations, and LED chips.

In another aspect, the disclosure relates to a patterned, wetted substrate: (a) a substrate; (b) a bulk patterned second metal layer adjacent to the substrate, the bulk second metal layer comprising a second metal and optionally a first metal, the first metal being at a lower concentration than the second metal in the bulk patterned second metal layer when present; and (c) an interfacial layer between the bulk patterned second metal layer and the substrate, the interfacial layer comprising the first metal; wherein the second metal has a lower melting point than that of the first metal. The bulk patterned second metal layer (e.g., as an outer, top, or external layer) generally includes only minor amounts of the first metal (e.g., up to 1, 2, 5 wt. % of a minor immiscible component in a primary component). A large portion of the first metal can remain as an interfacial layer on the substrate, positioned between the substrate and the bulk second metal layer. The interfacial layer can include portions of the porous first metal layer remaining at least partially or substantially intact as a discrete structure of the interfacial layer in which the pores have been wetted or infiltrated by the second metal material. The interfacial layer can have the same pattern corresponding to that of the bulk patterned second metal layer (e.g., as a result of an initially patterned first porous metal layer).

Various refinements of the disclosed patterning methods, methods for forming an electronic component, and patterned, wetted substrate are possible.

In a refinement, the porous first metal layer has a spatial pattern corresponding (or complementary) to that of the patterned second metal material. The porous first metal layer can be formed in the same (two-dimensional) spatial pattern as the second metal material generally using the same techniques described below for forming the patterned second metal material, for example by printing or otherwise applying a first metal mixture including a first liquid formulation and first metal particles in a predetermined pattern on the substrate, followed by pre-sintering. In some embodiments, the second metal layer is applied in the desired pattern on the complementary pattern of the porous first metal layer. In other embodiments, for example when the first porous layer has a continuous and interconnected patterned structure, the second metal layer can be applied over the first porous layer in any desired pattern or with no pattern (e.g., as a continuous overlayer of second metal material). In such cases, upon melting of the second metal, the molten second metal will then be wicked to infiltrate or fill the first porous metal layer patterned network and become a dense structure with the same design or pattern of the first porous metal layer (e.g., due to the relative lack of adhesion between the second metal material and substrate). For example, if the lower melting point second metal is in contact with the first porous metal (e.g., adjacent, beside, etc. the first porous metal layer), the second metal could be patterned as adjacent reservoirs and be printed on the same substrate surface as the higher melting point material, and the second metal would be subsequently wicked into the desired pattern of the first porous metal layer upon melting. In another embodiment, the lower melting point second metal layer can be deposited on the substrate and below the first porous metal layer (e.g., by methods such as sputtering). In such cases, the deposition of the first porous metal layer (e.g., in the desired pattern for the second metal layer) can wet the sputtered second metal layer and bring the first porous metal layer into contact with the substrate, thus bonding the second metal layer to the substrate in the desired pattern. The molten second metal material not close to the first porous metal layer will be wicked away from the interface by the surface tension with the first porous metal layer.

In a refinement, the patterned second metal material has a spatial pattern corresponding to electronic circuitry (e.g., electrodes, wires, interconnects). For electronic circuitry applications, the patterned second metal material suitably includes a metal with high electrical conductivity, such as silver or copper. The minimum dimension (e.g., line width) of the patterned second metal material can be controlled, for example, based on the powder size of the initial second metal material (e.g., when deposited as a suspension in a liquid formulation prior to melting) and/or the deposition technique (e.g., screenprinting, 3D printing etc.). For example, with the screenprinting used in the illustrative embodiments in the example, lines with a width as low as about 200 µm can be produced. In other embodiments, minimum pattern line widths of about 50, 80, 100, 120, or 150 µm can be used, for example minimum pattern line widths of at least 50, 80, 100, 120, 150, or 200 µm and/or up to 100, 150, 200, 500, or 1000 µm.

The spatial patterns, whether for electronic circuitry or otherwise, can be formed by lithographic methods, for example where there is a mask that is preferentially removed to deposit a desired material, such as by electro deposition. Lithographic methods could be used to provide masking of regions where the first porous metal layer would not be applied to the substrate, enabling other methods of applying a porous metal powder onto the exposed substrate, by means of liquid or gas assisted electrostatic methods for particle deposition, on which a uniform deposition of the lower melting point second metal material could be deposited by various methods, such as sputtering, electrodeposition, etc. Also, additive manufacturing methods could be used to deposit first metal powder particles and concurrently locally heat the deposited powder to partially sinter particles to adhere to the substrate, for example in the desired pattern. More generally, the higher melting temperature porous first metal layer serves to alter the interfacial energies between the three components (i.e., first and second metals, substrate), thus promoting wetting between the lower melting temperature second metal layer and the substrate. Any spatial arrangement of the three components can be used, as long as it promotes bonding or adhesion between the lower melting temperature second metal and the substrate (e.g., ceramic or otherwise).

In a refinement, the first metal comprises at least one of nickel, aluminum, cobalt, iron, copper, titanium and combinations thereof (e.g., mixtures or alloys thereof); and the second metal comprises at least one of silver, aluminum, tin, bismuth, nickel, copper, gold, cobalt, and combinations thereof (e.g., mixtures or alloys thereof). Some metals such as aluminum, nickel, cobalt, copper could be useful as either the first or second metal based on its particular melting point relative to the other metal. Examples of specific combinations of first/second metals include Ni/Ag, Fe/Ag, Co/Ag, Al/Sn, Cu/Bi, and Fe/Bi. The first metal or alloy is preferably selected for its relative slowness to oxidize, such as Ni, Co, Fe, and Co—Ni (alloy), which have some degree of oxidation resistance and a high relative melting point compared to a second metal selection. In some cases, the first/second metal combinations are selected such that the first and second metals are relatively immiscible in each other such that a bulk layer in the final structure is substantially composed of a bulk second metal layer (e.g., as an outer, top, or external layer) with only minor amounts of the first metal (e.g., up to 1, 2, 5 wt. % of a minor immiscible component in a primary component). A large portion of the first metal can remain as an interfacial layer on the underlying substrate, or positioned between the substrate and the bulk second metal layer. The interfacial layer can include portions of the porous first metal layer remaining at least partially or substantially intact as a discrete structure of the interfacial layer in which the pores have been wetted or infiltrated by the second metal material. In yet other cases the first metal could be miscible with the second metal and dissolve into the bulk second metal layer as a homogeneous component (e.g., up to 1, 2, 5, 10, 20, or 30 wt. % of a minor miscible component in a primary component). Preferably, the first metal, the second metal, and the substrate are selected based on a relative inability of the second metal to wet the substrate material in isolation, for example being characterized by wetting/contact angles of the second metal on the first metal or the substrate material individually of at least 20°, 30°, 40°, or 50° when measured in air or an inert atmosphere such as nitrogen. The porous nature of the first metal layer promotes efficient wetting by the molten second metal of both the porous first metal layer and the first substrate.

In a refinement, the underlying substrate comprises a ceramic material (e.g., generally an inorganic, non-metallic oxide, nitride or carbide material).

In a further refinement, the ceramic material is selected from the group consisting of aluminum oxide, aluminum nitride, gallium nitride, aluminum gallium nitride, aluminum gallium indium nitride, beryllium oxide, zirconium oxide, cerium oxide, zinc oxide, silicon carbide, silicon nitride, tungsten carbide, doped derivatives thereof, and combinations thereof. A doped derivative can include any of the foregoing ceramic material, for example with up to about 5, 10, or 15 mol. % of other elements or oxides added thereto.

In a further refinement, the ceramic material comprises one or more of aluminum oxide (alumina), aluminum nitride, gallium nitride, aluminum gallium nitride, aluminum gallium indium nitride, beryllium oxide, silicon carbide, and silicon nitride. Alumina, aluminum nitride, beryllium oxide, and silicon nitride are particularly suitable for circuit board materials, given their favorable thermal conductivity and ability to withstand and dissipate heat. Alumina with different purities can be used as well as alumina with different dopants too (e.g., Zr). Alumina is a suitable substrate for near-room-temperature electronics. Ceramics such as gallium nitride, aluminum gallium indium nitride, and silicon carbide are particularly suitable for electronics operating high temperatures, such as 250° C. to 900° C., especially high power electronics.

In a further refinement, the ceramic material comprises a stabilized zirconium oxide (zirconia) (e.g., a ceramic in which the crystal structure of zirconium dioxide is stabilized at room temperature by an addition of an additional oxide material such as up to about 10 mol. % of the additional oxide). For example, the stabilized zirconium oxide (zirconia) can be selected from the group consisting of yttrium oxide (yttria)-stabilized zirconia (YSZ), calcium oxide (calcia)-stabilized zirconia, magnesium oxide (magnesia)-stabilize zirconia, cerium oxide (ceria)-stabilized zirconia, scandium oxide (scandia)-stabilized zirconia, aluminum oxide (alumina)-stabilized zirconia, cerium oxide, doped cerium oxide, and combinations thereof (e.g., common SOFC solid electrolytes include yttria-stabilized zirconia (YSZ) such as with 8 mol. % yttira, scandia-stabilized zirconia (ScSZ) such as with 9 mol. % scandia, and gadolinium doped ceria (GDC)).

In a further refinement, the ceramic material comprises one or more of lanthanum strontrium manganite, lanthanum strontium cobaltite, and lanthanum strontium ferrite. Such ceramic materials can be useful in solid oxide fuel cell (SOFC) electrodes.

In a refinement, the underlying substrate comprises one or more of a metal material and a semiconductor material. A metallic substrate can be useful if the second metal (e.g., silver or otherwise) does not have very good wetting properties on the metallic substrate. In an embodiment, a metallic substrate can include a ceramic coating on the surface (e.g., a stainless steel with alumina coating), and the first and second metals according to the disclosure can be applied to the ceramic coating of the substrate.

In a refinement, the porous first metal layer has a thickness ranging from 0.01 μm to 250 μm, such as 5 μm to 40 μm or 10 μm to 30 μm (e.g., at least 0.01, 0.1, 1, 2, 3, 5, 8, 10, 15, 20, or 30 μm and/or up to 10, 20, 30, 40, 60, 100, 200, or 250 μm). The porous first metal layer need not have a uniform thickness, and the foregoing thickness values can represent an average layer thickness and/or a range for a spatially variable local layer thickness.

In a refinement, the porous first metal layer comprises pores ranging in size from 0.005 μm to 50 μm (e.g., at least 0.005, 0.05, 0.5, 1, 2, 3, 5, or 10 μm and/or up to 5, 10, 15, 20, 30, or 50 μm). The foregoing size values can represent an average pore size and/or a range for distributed pores sizes throughout the first metal layer.

In a refinement, providing the porous wetting substrate comprises: (a1) applying to the underlying substrate a layer of a first metal mixture comprising a first liquid formulation and first metal particles dispersed in the first liquid formulation; and (a2) (optionally) pre-sintering the layer of the first metal mixture (e.g., in a protective pre-sintering atmosphere) at a temperature and pressure sufficient to remove the first liquid formulation and at least partially sinter the first metal particles, thereby forming the porous first metal layer (e.g., adhered to the underlying substrate). The first metal mixture suitably is in the form of a solution, thick paste, or suspension, etc. that coats the first substrate in the target area of interest. The first metal mixture can include at least 30, 50, or 70 wt. % first metal particles and/or up to 50, 70, or 90 wt. % first metal particles, at least 10, 30, or 50 wt. % liquid formulation and/or up to 30, 50, or 70 wt. % liquid formulation. The liquid formulation can include a liquid solvent medium (e.g., water, isopropanol or other alcohol or organic solvent), a liquid binder to improve green strength (e.g., a polymeric binder dissolved in the solvent medium), and/or a dispersant to prevent agglomeration of the first metal particles in a stable first metal mixture (e.g., a polymeric dispersant dissolved in the solvent medium). Pre-sintering generally includes subjecting the first metal mixture layer to a gradually ramping temperature that removes the liquid formulation, for example degrading, decomposing, etc. any polymer additives therein and at least partially fusing the first metal particles to form the porous first metal layer. Sintering generally includes applying heat and/or pressure at a level and time sufficient to fuse the particles of the sintering composition without substantial melting such as to liquefaction. In some alternative embodiments, the porous first metal layer can be applied not only through deposition techniques, but also by other chemical approaches, for example by coating the substrate surface with a metal oxide layer (e.g., NiO) which is then reduced to a corresponding metal (e.g., Ni) and also generates nano- or meso-scale porosity in the metal during the reduction process. In some alternative embodiments, a separate pre-sintering step (a2) before heating the second metal can be omitted, for example when the heating of the second metal is sufficient to induce sintering of the first metal mixture layer and form the porous first metal layer prior to and/or concurrently with the molten second metal.

In a further refinement, the first liquid formulation comprises a polymeric solution. The liquid formulation can generally include any polymeric binder, dispersant, resin, or other liquid vehicle. In some cases, the polymeric binder can be a curable binder such that the corresponding cured binder or resin is degradable at an intermediate temperature between its curing temperature and the pre-sintering temperature. An example binder system includes ethylene glycol monobutyl ether, ethylene glycol, and isopropanol.

In a further refinement, the first metal mixture layer has a thickness ranging from 0.01 µm or 2 µm to 100 µm, such as 5 µm to 40 µm or 10 µm to 30 µm (e.g., at least 0.01, 0.1, 1, 2, 3, 5, 8, 10, or 15 µm and/or up to 10, 20, 30, 40, 60 or 100 µm). The foregoing thickness values can represent an average layer thickness. The first metal mixture layer can be comparable but generally larger in thickness relative to that of the eventual porous first metal layer.

In a further refinement, the first metal particles have a size ranging from 0.01 µm or 2 µm to 50 µm (e.g., a number-, mass-, or volume-average particle size or diameter, such as at least at least 0.01, 0.1, 1, 2, 3, 5, 8, or 10 µm and/or up to 10, 20, 30, 40, 50 µm; such as 3 µm to 20 µm or 5 µm to 10 µm). The foregoing ranges can similarly represent the span (such as D10-D90) of the first metal particle size distribution. In a yet further refinement, the porous first metal layer has a thickness ranging from 1 to 10 (e.g., 1.5 or 2 to 5 or 8) times the average particle size of the first metal particles prior to pre-sintering (e.g., relative to the number-, mass-, or volume-average particle size or diameter of the first metal particles as added to the first metal mixture).

In a further refinement, pre-sintering comprises heating the layer of the first metal mixture to a maximum temperature ranging from 600° C. to 1400° C. (e.g., at least 600° C., 800° C., or 1000° C. and/or up to 1000° C., 1200° C., or 1400° C.). Alternatively or additionally, pre-sintering heating can comprise heating to a maximum temperature that is at least 100, 200, or 300° C. and/or up to 300, 500, or 700° C. lower than the first metal melting point, such as ramping from ambient/room temperature of first metal mixture application at a rate of about 2-10, 50, or 100° C./minute up to the maximum temperature, optionally holding at the maximum temperature for up to 0.1-5 hours, and then reducing the temperature back to ambient/room temperature at a rate of about 2-10, 50, or 100° C./minute. Pre-sintering is performed at a temperature sufficient to eliminate the liquid formulation (e.g., evaporate solvent, decompose/eliminate any polymeric additives), but less than a temperature sufficient to fully sinter the first metal. At such temperatures, partial sintering/fusing of some particles can occur to a degree sufficient to provide a porous first metal structure even in the absence of polymeric additives.

In a further refinement, the method comprises performing pre-sintering in a protective pre-sintering atmosphere comprising at least one of argon and nitrogen (e.g., more generally any inert or protective atmosphere that avoids or prevents oxidation of the first metal particles during pre-sintering). The protective pre-sintering atmosphere can be essentially completely inert gases such as argon, nitrogen, or a mixture thereof, such as at least 90, 95, 98, 99, or 99.9 mol. % inert gases. A reducing gas such as hydrogen can be included in the protective atmosphere to protect against oxidation, such as at least 1 or 2 mol. % and/or up to 5 or 10 mol. % reducing gas. The protective atmosphere is generally at a pressure of about 1 atm or slightly higher to limit entry of external air during pre-sintering. The partial pressure of oxygen gas ($pO_2$) in the protective atmosphere is generally selected to maintain a metallic surface on the first metal particles and porous layer, which can vary with the particular type of first metal, but is suitably about $10^{-6}$ atm or less in many cases.

In a refinement, applying a patterned second metal material comprises: (b1) applying to the porous wetting substrate a patterned layer of a second metal mixture comprising a second liquid formulation and second metal particles dispersed in the second liquid formulation. The second metal mixture suitably is in the form of a solution, thick paste, or suspension, etc. that coats the porous wetting substrate (e.g., onto the porous first metal layer thereof) in the target area of interest. The second metal mixture is applied in a pattern on the porous wetting substrate, for example via a printing process (e.g., application of a liquid or semi-liquid second metal mixture with a print head in fluid communication with a reservoir of the second metal mixture) in a preselected, controlled pattern. Other methods of applying a patterned second metal material (e.g., using a second metal mixture including the second liquid formulation or otherwise) can include tape-casting, deposition, masking coating, and 3D printing. The second metal mixture can include at least 30, 50, or 70 wt. % second metal particles and/or up to 50, 70, or 90 wt. % second metal particles, at least 10, 30, or 50 wt. % liquid formulation and/or up to 30, 50, or 70 wt. % liquid formulation. The second liquid formulation can include a liquid solvent medium (e.g., water, isopropanol or other alcohol or organic solvent), a liquid binder to improve green strength (e.g., a polymeric binder dissolved in the solvent medium), and/or a dispersant to prevent agglomeration of the second metal particles in a stable second metal mixture (e.g., a polymeric dispersant dissolved in the solvent medium).

In a further refinement, the second liquid formulation comprises a polymeric solution. The second liquid formulation can generally include any polymeric binder, dispersant, resin, or other liquid vehicle. In some cases, the polymeric binder can be a curable binder such that the corresponding cured binder or resin is degradable at an intermediate temperature between its curing temperature and the heating/melting temperature of the second metal material. An example binder system includes ethylene glycol monobutyl ether, ethylene glycol, and isopropanol.

In a further refinement, the second metal mixture layer has a thickness ranging from 0.01 μm or 2 μm to 500 μm, such as 5 μm to 40 μm or 10 μm to 30 μm (e.g., at least 0.01, 0.1, 1, 2, 3, 5, 8, 10, or 15 μm and/or up to 10, 20, 30, 40, 60, 100, 150, 200, or 500 μm). The foregoing thickness values can represent an average layer thickness. The second metal mixture layer can be comparable but generally larger in thickness relative to that of the eventual patterned, wetted second metal layer.

In a further refinement, the second metal particles have a size ranging from 0.01 μm or 2 μm to 50 μm (e.g., a number-, mass-, or volume-average particle size or diameter, such as at least at least 0.01, 0.1, 1, 2, 3, 5, 8, or 10 μm and/or up to 10, 20, 30, 40, 50 μm; such as 3 μm to 20 μm or 5 μm to 10 μm). The foregoing ranges can similarly represent the span (such as D10-D90) of the second metal particle size distribution. In a yet further refinement, the second metal mixture layer has a thickness ranging from 1 to 10 (e.g., 1.5 or 2 to 5 or 8) times the average particle size of the second metal particles prior to heating (e.g., relative to the number-, mass-, or volume-average particle size or diameter of the second metal particles as added to the second metal mixture).

In a refinement, applying a patterned second metal material comprises: (a1) applying to the underlying substrate a patterned layer of a first metal mixture comprising a first liquid formulation and first metal particles dispersed in the first liquid formulation; (a2) pre-sintering the patterned layer of the first metal mixture at a temperature and pressure sufficient to remove the first liquid formulation and at least partially sinter the first metal particles, thereby forming a patterned porous first metal layer; (b1) applying the second metal material to the porous wetting substrate and in contact with the patterned porous first metal layer thereon; and (c1) heating the second metal at a temperature and pressure sufficient to melt the second metal material, wet pores of the patterned porous first metal layer with the molten second metal material, and contact the underlying substrate with the molten second metal material, thereby forming a wetted substrate comprising the underlying substrate, and a patterned, wetted second metal layer adhered to the underlying substrate with a pattern corresponding to that of the patterned porous first metal layer.

In a refinement, heating the second metal comprises: (c1) heating the second metal to a maximum temperature ranging from 600° C. to 1200° C. (e.g., at least 600° C., 800° C., or 1000° C. and/or up to 1000° C., 1100° C., or 1200° C.). Alternatively or additionally heating can comprise heating to a maximum temperature above the second metal melting point of the second metal but less than the first metal melting point, such as at least 25, 50, 100, 200, or 300° C. and/or up to 300, 500, or 700° C. lower than the first metal melting point; such as ramping from ambient/room temperature at a rate of about 2-10, 50, or 100° C./minute up to the maximum temperature, optionally holding at the maximum temperature for up to 0.1-5 hours, and then reducing the temperature back to ambient/room temperature at a rate of about 2-10, 50, or 100° C./minute. The heating process is performed at a temperature and pressure sufficient to melt the second metal material. The molten second metal material then wets the pores of the porous first metal layer to penetrate the first metal layer pores and contact the underlying substrate with controlled/limited (lateral) spreading such that the molten second metal material retains substantially the same (two-dimensional) spatial pattern of the patterned second metal material as applied to the porous wetting substrate. The result of the heating process is a wetted substrate including the substrate and a patterned, wetted second metal layer adhered to the substrate. Heating generally includes subjecting the second metal to a gradually ramping temperature that removes the second liquid formulation (when present and used to apply a second metal mixture including the second metal as described above), for example degrading, decomposing, etc. any polymer additives therein and melting the second metal particles to form the molten second metal and patterned, wetted second metal layer.

In a refinement, the method comprises performing heating the second metal in a protective atmosphere comprising at least one of argon and nitrogen (e.g., more generally any inert or protective atmosphere that avoids or prevents oxidation of the nickel porous layer during heating). The protective heating atmosphere can be essentially completely inert gases such as argon, nitrogen, or a mixture thereof, such as at least 90, 95, 98, 99, or 99.9 mol. % inert gases. A reducing gas such as hydrogen can be included in the protective atmosphere to protect against oxidation, such as at least 1 or 2 mol. % and/or up to 5 or 10 mol. % reducing gas. The protective atmosphere is generally at a pressure of about 1 atm or slightly higher to limit entry of external air during heating. The partial pressure of oxygen gas ($pO_2$) in the protective atmosphere is generally selected to maintain a metallic surface on the first and second metals, which can vary with the particular type of first and second metals, but is suitably about $10^{-6}$ atm or less in many cases.

In a refinement, the second metal material comprises at least 90 wt. % of the second metal (e.g., at least 90, 95, 98, 99, or 99.9 wt. % second metal, with the balance being other alloy or impurity elements).

In a refinement, the second metal material is free from air-reactive components. For example, the second metal material can be free from oxygen-reactive components such as reducible or oxidazable species, such as copper, indium, zirconium, titanium, zinc, tin, manganese, lithium, and/or silicon, and further including species containing the foregoing elements (e.g., copper-containing species such as CuO).

In a refinement, the patterned, wetted substrate further comprising one or more electronic components (e.g., processor, memory) mounted to the to the pattern, wetted substrate in electrical connection to an element of the bulk patterned second metal layer; wherein the bulk patterned second metal layer has a spatial pattern corresponding to electronic circuitry. The electronic components also can be interconnected with each other via one or more second metal pattern elements.

In a refinement of the patterned, wetted substrate, the bulk patterned second metal layer has a first metal concentration of 20 wt. % or less (e.g., comprising at least 0.1, 1, 2, or 5 wt. % and/or up to 1, 2, 5, 10, 15, or 20 wt. % first metal, where the concentration can represent an average concentration across the bulk second metal layer and/or a range spanning/including the local maximum and minimum concentration across the bulk second metal layer); and the interfacial layer has a first metal concentration of at least 10 wt. % and greater than the first metal concentration of the bulk patterned second metal layer (e.g., at least 10, 15, 20, or 30 wt. % and/or up to 30, 40, 50, 60, 80, 90, or 95 wt. % first metal, where the concentration can represent an average concentration across the interfacial layer and/or a range spanning/including the local maximum and minimum concentration across the diffusion layer). Relative high/low concentrations of the first metal in the interfacial layer and the bulk patterned second metal layer can be based on the average first metal values in the corresponding layers.

In a refinement of the patterned, wetted substrate, the bulk patterned second metal layer has a second metal concentration ranging from 70 wt. % to 99 wt. % (e.g., at least 70, 80, 90, or 95 wt. % and/or up to 75, 85, 95, 98, or 99 wt. % second metal). The concentration can represent an average concentration across the bulk patterned second metal layer and/or a range spanning/including the local maximum and minimum concentration across the bulk patterned second metal layer.

In a refinement of the patterned, wetted substrate, the bulk patterned second metal layer is substantially free from discrete first metal particles having a size greater than 1 μm. For example the original porous first metal layer formed during fabrication can be essentially completely disintegrated. The first metal present in the bulk second metal layer can be in the form of a continuous mixture or alloy with the second metal and not as discrete larger first metal particles such as those originally used to form the porous first metal layer. Alternatively or additionally, first metal present in the bulk second metal layer can be present in sub-micron sized discrete particles from the porous first metal layer that were not completely disintegrated during heating, such as less than 1000, 500, 200, 100, or 10 nm in size whether on average or for the entire distribution.

While the disclosed compounds, articles, methods and compositions are susceptible of embodiments in various forms, specific embodiments of the disclosure are illustrated (and will hereafter be described) with the understanding that the disclosure is intended to be illustrative, and is not intended to limit the claims to the specific embodiments described and illustrated herein.

BRIEF DESCRIPTION OF THE DRAWINGS

For a more complete understanding of the disclosure, reference should be made to the following detailed description and accompanying drawings wherein.

DETAILED DESCRIPTION

Figure 1:
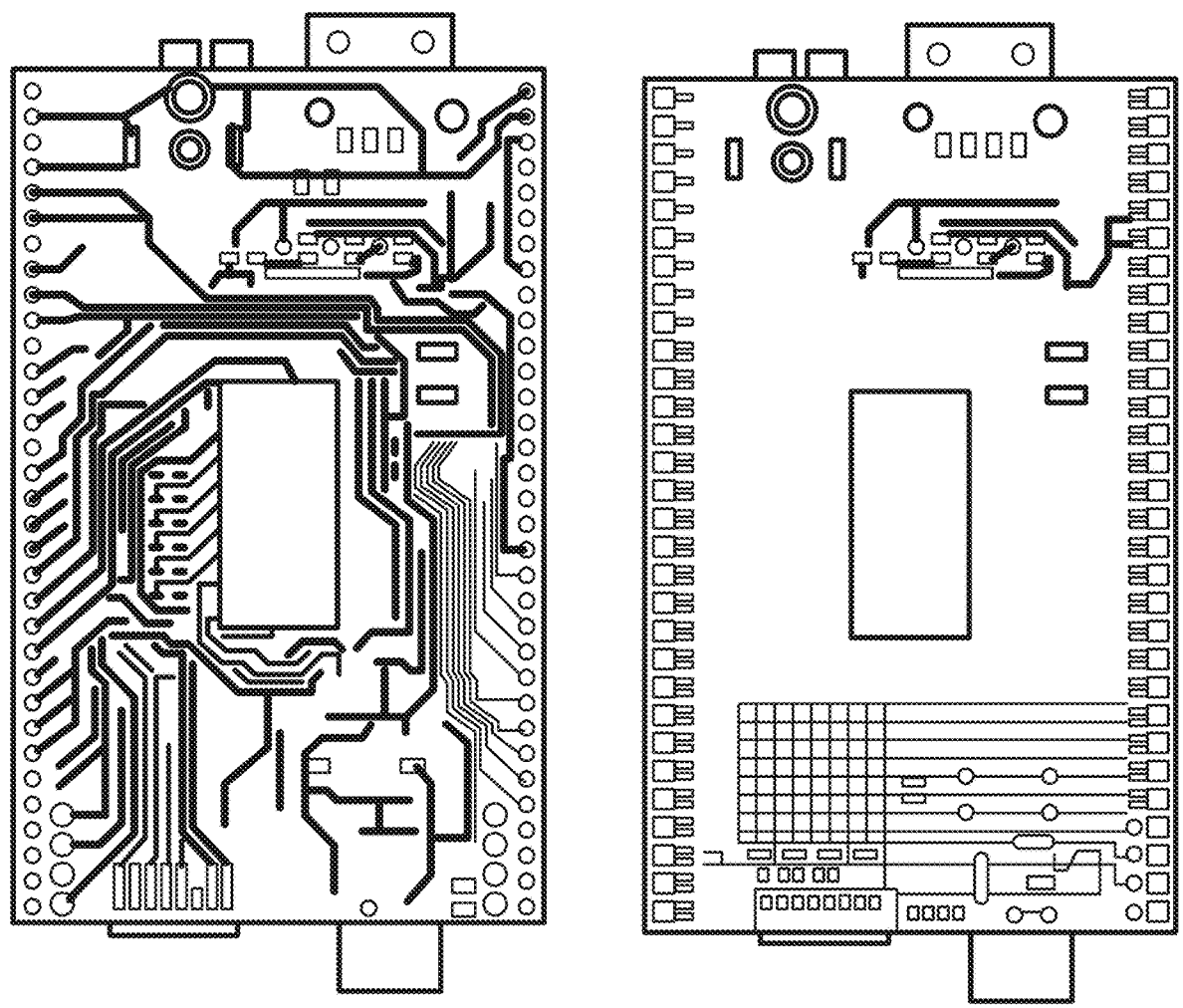
FIG. 1 illustrates printed circuit boards (about 8 cm×5 cm) on a ceramic substrate (left) and a conventional substrate (right).
Figure 2:
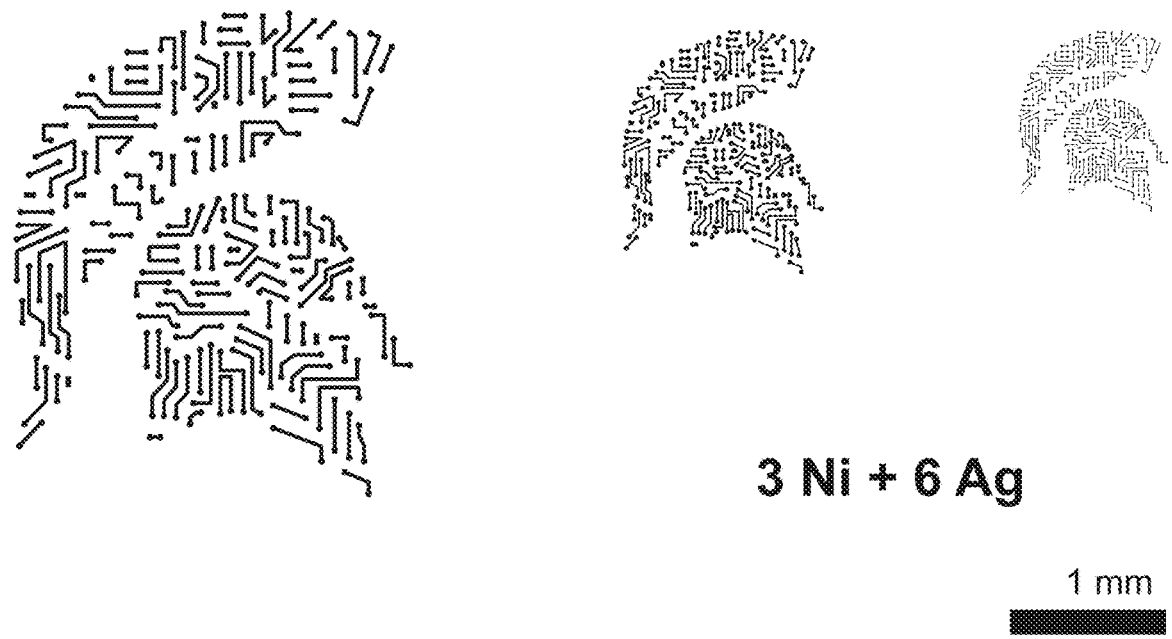
FIG. 2 illustrates silver circuits formed on ceramic (alumina) substrates using a porous nickel interlayer according the disclosure (scale bar=1 mm).

The disclosure generally relates to a method of creating patterned metallic circuits (e.g., silver circuits) on a substrate (e.g., a ceramic substrate). In this process, a porous metal interlayer (e.g., porous nickel) is applied to the substrate to improve wetting and adhesion of the patterned metal circuit material to the substrate. The substrate is heated to a temperature sufficient to melt the patterned metal circuit material but not the porous metal interlayer. Spreading of molten metal circuit material on the substrate is controlled by the porous metal interlayer, which can itself be patterned, such as having a defined circuit pattern. Thick-film silver or other metal circuits can be custom designed in complicated shapes for high temperature/high power applications. The materials designated for the circuit design allows for a low-cost method of generating silver circuits other metal circuits on a ceramic substrate. FIG. 2 illustrates silver circuits formed on ceramic (alumina) substrates using a porous nickel interlayer having a complementary pattern to that of the silver circuits and three different representative length/size scales.

Common manufacturing processes use physical vapor deposition (PVD) to produce silver circuits. The PVD process is expensive and generates porous and thin circuits creating large amounts of resistance. The high resistance consequence of PVD is not ideal for high amperage electronics. The disclosed method advantageously generates dense silver circuits with tunable thickness ranging from 10 microns to 1 millimeter, thereby making the method and resulting articles suitable for high-temperature, high-amperage applications. Another potential application for the technology is the ability to use the silver as a way to bond ceramics together.

Figure 3:
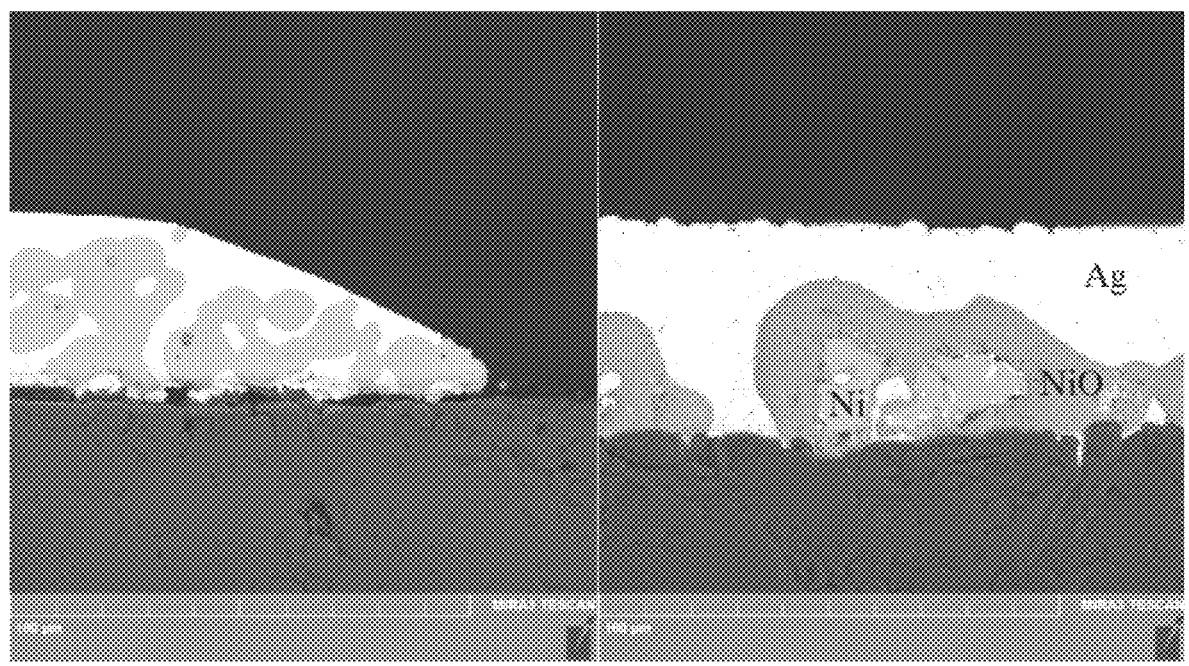
FIG. 3 provides a cross sectional view of the silver/nickel/ceramic circuit embodiment of FIG. 2, with some degree of oxidation being evident in the right panel (scale bar=100 μm in both panels).

Oxidation testing of the resulting articles has been conducted with images of the results displayed below in FIG. 3 for silver/nickel/ceramic embodiment illustrated in FIG. 2. As seen in the right panel of FIG. 3, some oxidation of the nickel does occur, with the darker grey region in right panel corresponding to NiO, the lighter grey region corresponding to Ni, the white region corresponding to Ag, and the dark bottom portion is the ceramic substrate. Oxidation is harmful to the circuit components, because it weakens the connection of the silver to the ceramic substrate. However, the mechanical durability of the circuit was unaffected by the small amounts of oxidation present in the fabricated examples.

In a particular embodiment of the disclosure, a porous interlayer of nickel on a ceramic substrate can be used to control the wetting and spreading of molten silver on the ceramic substrate, which is otherwise difficult to wet directly with silver. This technique can be used to produce silver circuits on ceramic substrates. As shown in FIG. 2, the method can be used to produce inexpensive thick-film silver circuits in complicated shapes for high-temperature/high-power applications using a porous interlayer of nickel (which can also be patterned) on a ceramic substrate. Unlike existing physical vapor deposition (PVD) processes which produce dense silver circuits but are expensive and limited to thin circuit lines (e.g., 1 micron or less thick) that cannot handle high power, or existing thick-film techniques which produce thick (e.g., up to 100 microns thick) silver circuits that are porous and hence have an undesirably higher resistance, the silver circuits according to the disclosure (e.g., a patterned silver circuit on a porous nickel interlayer) are both dense and thick. The high density/lack of porosity and high thickness of patterned metal layers (e.g., formed from silver or otherwise) formed according to the disclosure results in a low resistivity of the patterned metal layers suitable for high power applications. The patterned metal layers also can be fabricated made inexpensively (e.g., via screen printing). The patterned metal layers suitably can have a controlled thickness, for example ranging from about 10 μm to about 1 mm (e.g., at least 10, 20, 50, or 100 μm and/or up to 50, 100, 200, 500, or 1000 μm).

Figure 4:
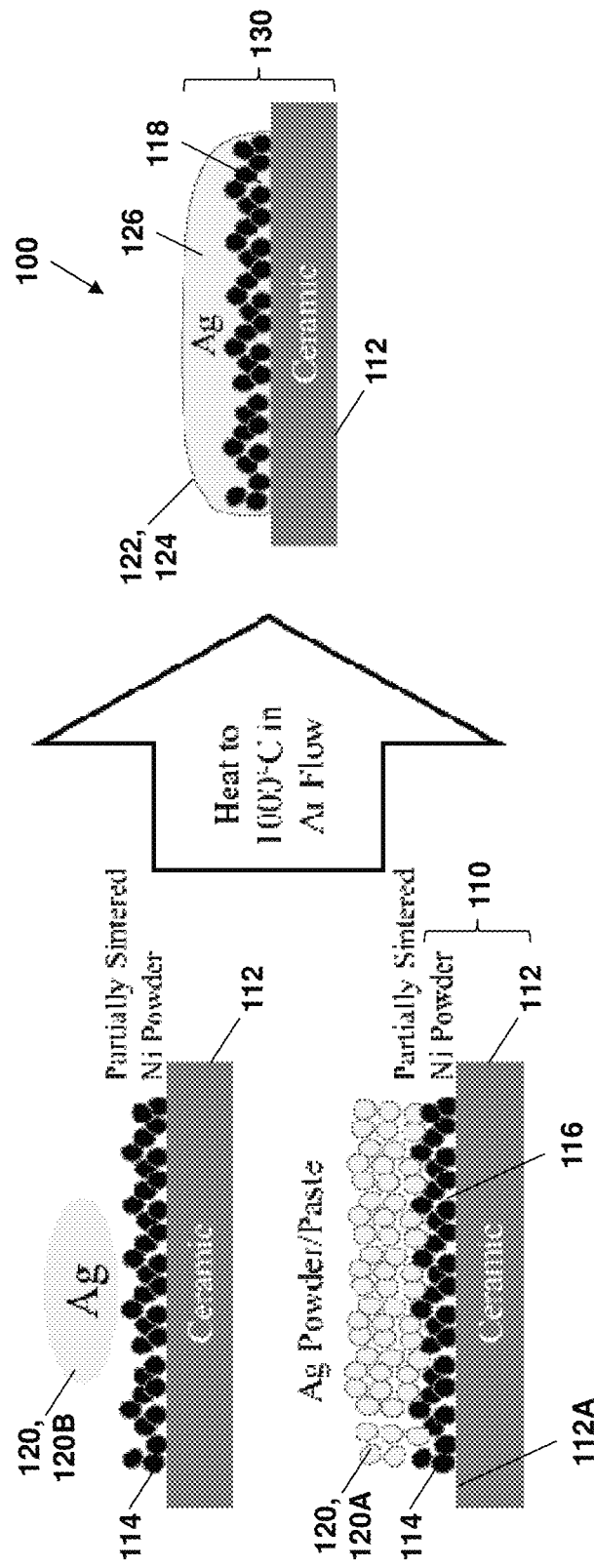
FIG. 4 is a schematic illustrating the method according to the disclosure.

FIG. 4 schematically illustrates the method according to the disclosure, which improves the wetting and controls the spreading of liquid silver or other metal on ceramic or other substrates. As illustrated in FIG. 4 for the specific case of silver adhered to a ceramic substrate using a porous nickel interlayer, the ternary presence of nickel alters the surface energy between the ceramic and liquid silver so that spontaneous infiltration occurs with wetting angles between silver and the ceramic being significantly lower than between the binary ceramic and liquid silver system. The heating, wetting, and spreading is suitably performed in an inert atmosphere.

Figure 5:
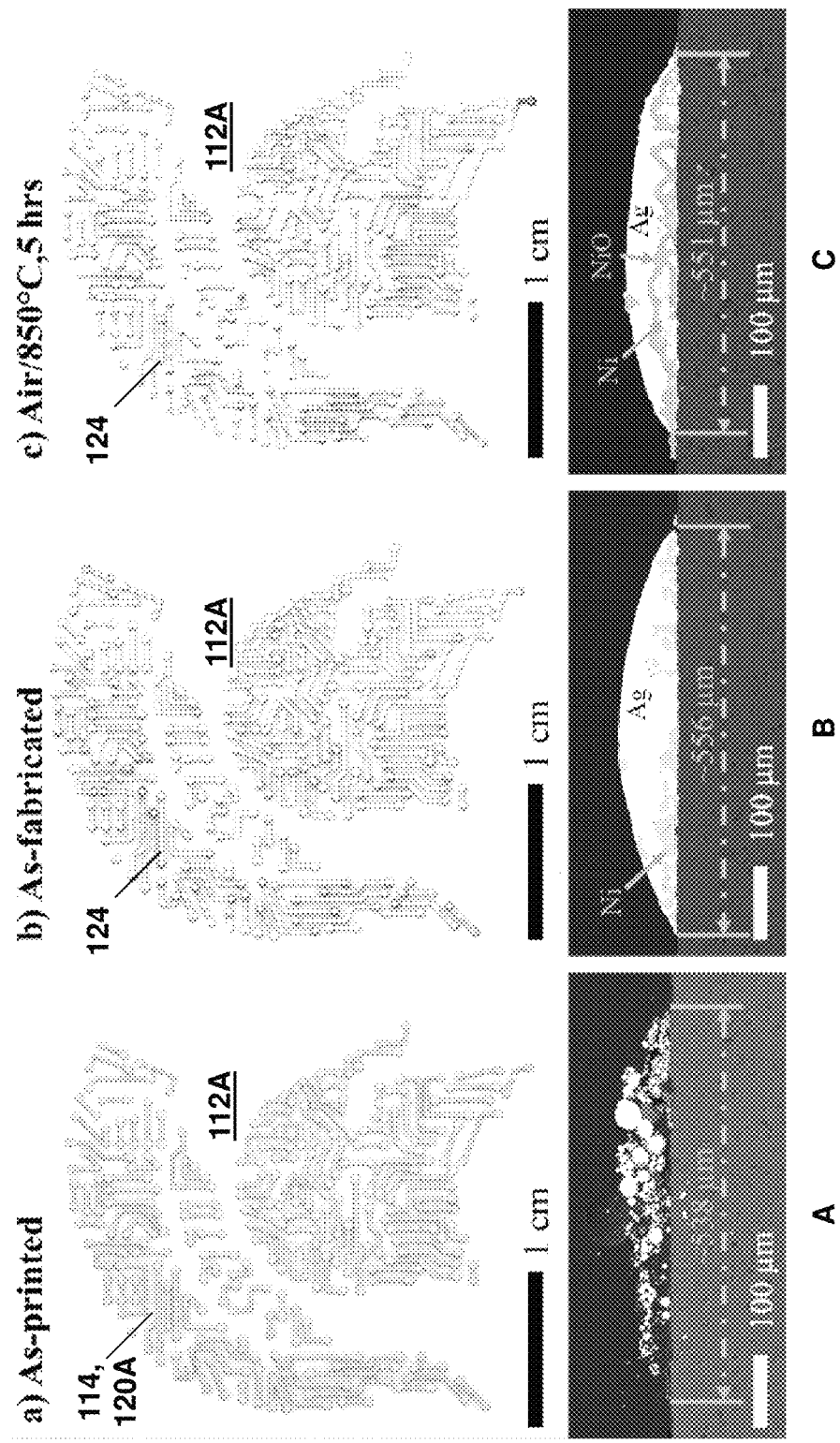
FIG. 5 includes top view images (top row) and side cross sectional images (bottom row) of patterned silver circuit structures on an alumina substrate with a porous nickel interlayer (scale bar=1 mm for top row, 100 μm for bottom row).

FIG. 5 illustrates the disclosed method as applied to form a patterned silver layer on a ceramic substrate, for example as an illustrative electric circuit design for high power/temperature electronics that use ceramic boards. Three layers of nickel paste and then six layers of silver paste were printed in the illustrated circuit pattern onto an alumina substrate in a (decorative) circuit pattern. In other applications, the nickel particles/porous layer and silver could be applied by various techniques like tape-casting, deposition, masking coating, 3D printing etc. Alternatively, any other method of achieving a porous nickel layer on a ceramic substrate could be used (e.g., air brushing, electroless coating, etc.). Then the assembly was heated up to about 1000° C. to melt only the silver in argon (inert atmosphere), allowing the molten silver to infiltrate the porous nickel network. At this temperature, the nickel particle layer does not melt or dissolve into the molten silver, serving as the base structure/design for the later formation of silver patterns. After solidification, the silver coverage on the ceramic substrate follows the initial pattern of the nickel paste because the nickel particles remain in place during the heating and cooling process, forming the prescribed pattern. This example illustrates that dense circuit can be produced on ceramic substrates. Oxidation has a limited effect on the microstructure because $Ag_2O$ is not stable above 200° C. The structure was observed to be stable at up to 850° C. in air.

Figure 6:
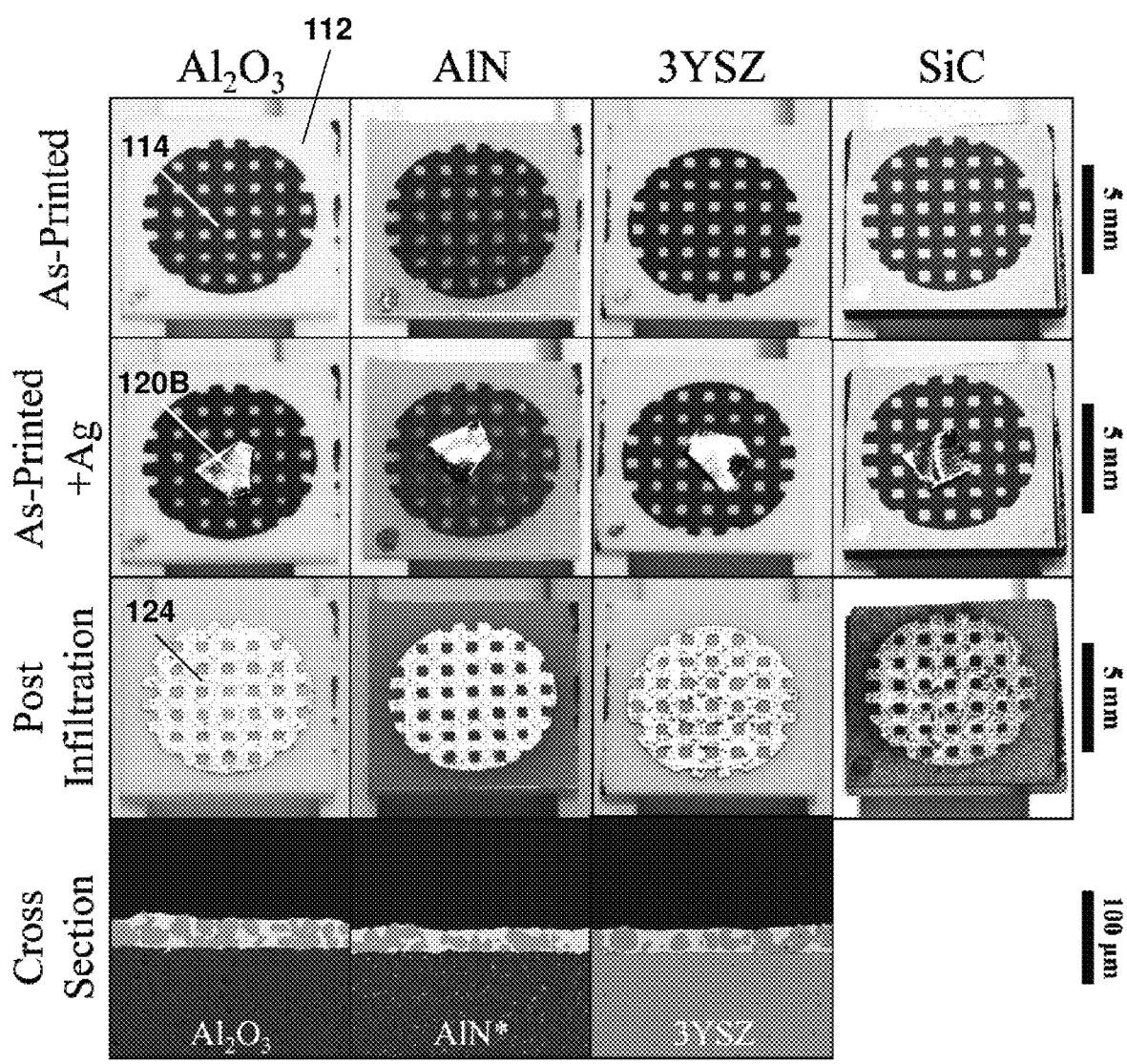
FIG. 6 illustrates an embodiment of the disclosed method in which the second metal layer is formed into the desired pattern by self-infiltration into a porous first metal layer having the desired pattern (scale bar=5 mm for top three rows, 100 μm for bottom row).

FIG. 6 illustrates an embodiment of the disclosed method in which the second metal layer is formed into the desired pattern by self-infiltration into a porous first metal layer having the desired pattern. The top row images in FIG. 6 illustrate a square lattice pattern of porous nickel printed on four different ceramic substrates (alumina, aluminum nitride, yttria-stabilized zirconia, and silicon carbide, respectively). The second row in FIG. 6 shows a small piece of silver foil placed on top of the patterned, porous nickel layer for each substrate. As shown, the silver metal material was not itself patterned and did not have any particular orientation on the porous nickel layer. The third row in FIG. 6 shows that after melting the silver, the molten silver infiltrated the porous nickel layer, and after solidification, formed a grid pattern just like the initial porous nickel layer. The silver was melted by (i) heating at 5° C./min to 1000° C., (ii) holding at 1000° C. for 2 hr, and (iii) cooling at 5° C./min to ambient temperature, all performed under an inert argon atmosphere at 20 sccm. The bottom row in FIG. 6 show representative cross-sections after silver melting and infiltration for the alumina, aluminum nitride, and yttria-stabilized zirconia substrates, where the patterned silver metal forms a continuous metal matrix with elements of the porous nickel layer therein. More generally, if the porous first metal layer pattern is interconnected and continuous, the second metal can be placed near a part of the porous first metal layer pattern (e.g., on top of, next to) and heated to above the melting point of second metal, which then is distributed via wetting and spreading throughout the porous first metal layer. Such structures could be useful for current collectors on electrodes.

The disclosed methods and articles provide several benefits. The methods can be carried out under inert atmosphere, a condition that is feasible in many production conditions. The methods and component materials are suitably non-reactive, for example being free from reactive materials such as copper, indium, zirconium, titanium, zinc, tin, manganese, lithium, silicon, and/or species including one or more of these elements. the methods do not require costly surface deposition techniques, making them more suitable for industrial applications. The methods can be combined with 3D printing technologies.

Figure 7:
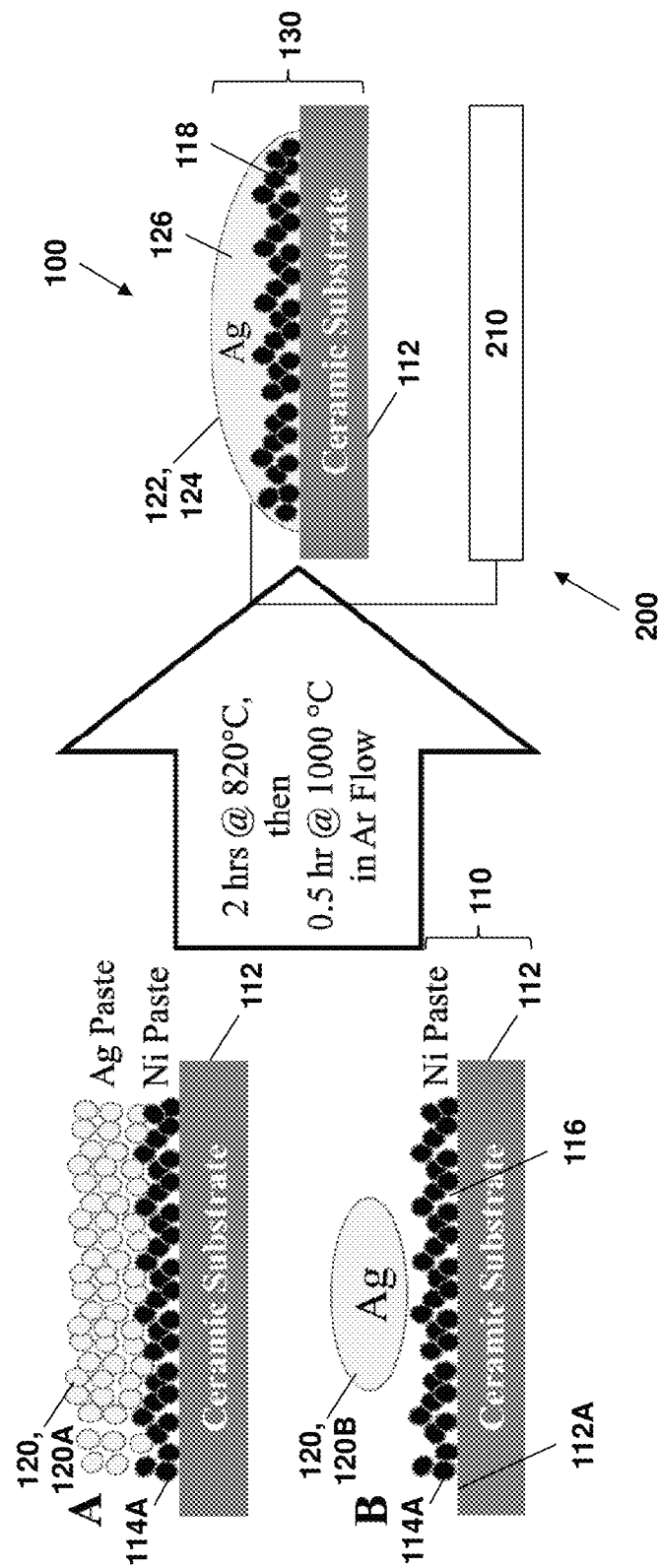
FIG. 7 illustrates two applications of the methods of the disclosure (A and B) that can be employed to achieve patterned metallic circuits.

As particularly illustrated in FIGS. 4 and 7, the disclosure relates to methods of forming a patterned, wetted substrate 100, for example including a patterned metal layer on a substrate. An initial porous wetting substrate 110 includes an underlying substrate 112 and a porous first metal layer 114 on an upper surface 112A of the underlying substrate 112. The first metal layer 114 includes pores 116, for example as interstitial pores or other areas between (partially) sintered particles of the first metal. The porous first metal layer 114 can be patterned, for example having been applied in a pattern (e.g., via a printing technique) or having been patterned after application. As described below, the porous first metal layer 114 can be formed by applying a first metal mixture 114A including particles of the first metal therein, which particles can then be sintered to form the porous first metal layer 114. A (patterned) second metal material 120 is then applied to the porous wetting substrate 110, for example atop and in contact with the porous first metal layer 114 thereon. As described below, the second metal material 120 can be applied in the form of a (patterned) layer of a second metal mixture 120A including second metal particles in a suitable vehicle or liquid formulation. Alternatively, the second metal material 120 can be applied in the form of a metal foil or layer 120B or other solid form of the second metal, in which case the second metal material 120 becomes patterned upon eventual heating and melting of the metal foil 120B. The second metal in the second metal material 120 has a lower melting point than that of the first metal to promote melting, infiltration, and/or spreading of liquid second metal at a temperature that substantially retains the first metal in its porous form. The second metal material 120 is then heated at a temperature and pressure sufficient to melt the second metal material 120, which in turn wets the pores 116 of the porous first metal layer 114 with the molten second metal material 122. Likewise, the molten second metal material 122 contacts the underlying substrate 112 (e.g., top surface 112A thereof) to form a wetted substrate 130. The wetted substrate 130 includes the underlying substrate 112 and a patterned, wetted second metal layer 124 adhered to the underlying substrate 112 (i.e., after cooling and solidification of the molten second metal).

In embodiments, the porous first metal layer has a spatial pattern corresponding to that of the patterned second metal material. The porous first metal layer can be formed in the same two-dimensional spatial pattern as the second metal material generally using the same techniques described below for forming the patterned second metal material, for example, by printing or otherwise applying a first metal mixture including a first liquid formulation and first metal particles in a predetermined pattern on the substrate, followed by pre-sintering. In some embodiments, the second metal layer is applied in the desired pattern on the complementary pattern of the porous first metal layer. In other embodiments, for example, when the first porous layer has a continuous and interconnected patterned structure, the second metal layer can be applied over the first porous layer in any desired pattern or with no pattern, for example, as a continuous overlayer of second metal material. In such cases, upon melting of the second metal, the molten second metal will then be wicked to infiltrate or fill the first porous metal layer patterned network and become a dense structure with the same design or pattern of the first porous metal layer (e.g., due to the relative lack of adhesion between the second metal material and substrate). For example, if the lower melting point second metal is in contact (e.g., adjacent or beside) with the first porous metal, the second metal could be patterned as adjacent reservoirs and be printed on the same substrate surface as the higher melting point material, and the second metal would be subsequently wicked into the desired pattern of the first porous metal layer upon melting. In another embodiment, the lower melting point second metal layer can be deposited on the substrate and below the first porous metal layer (e.g., by methods such as sputtering). In such cases, the deposition of the first porous metal layer (e.g., in the desired pattern for the second metal layer) can wet the sputtered second metal layer and bring the first porous metal layer into contact with the substrate, thus bonding the second metal layer to the substrate in the desired pattern. The molten second metal material not close to the first porous metal layer will be wicked away from the interface by the surface tension with the first porous metal layer.

In embodiments, the patterned second metal material has a spatial pattern corresponding to electronic circuitry. For example, the patterned second metal material can have a spatial pattern that is suitable for electrodes, wires, and/or interconnects. For electronic circuitry applications, the patterned second metal material suitably includes a metal with high electrical conductivity, such as silver or copper. The minimum dimension (e.g., line width) of the patterned second metal material can be controlled, for example, based on the powder size of the initial second metal material (e.g., when deposited as a suspension in a liquid formulation prior to melting) and/or the deposition technique (e.g., screen-printing, 3D printing etc.). For example, with the screen-printing used in the illustrative embodiments in the example, lines with a width as low as about 200 µm can be produced. In other embodiments, minimum pattern line widths of about 50, 80, 100, 120, or 150 µm can be used, for example minimum pattern line widths of at least 50, 80, 100, 120, 150, or 200 µm and/or up to 100, 150, 200, 500, or 1000 µm.

The spatial patterns, whether for electronic circuitry or otherwise, can be formed by lithographic methods, for example where there is a mask that is preferentially removed to deposit a desired material, such as by electro deposition. Lithographic methods could be used to provide masking of regions where the first porous metal layer would not be applied to the substrate, enabling other methods of applying a porous metal powder onto the exposed substrate, by means of liquid or gas assisted electrostatic methods for particle deposition, on which a uniform deposition of the lower melting point second metal material could be deposited by various methods, such as sputtering, electrodeposition, etc. Also, additive manufacturing methods could be used to deposit first metal powder particles and concurrently locally heat the deposited powder to partially sinter particles to adhere to the substrate, for example in the desired pattern. More generally, the higher melting temperature porous first metal layer serves to alter the interfacial energies between the three components (i.e., first and second metals, substrate), thus promoting wetting between the lower melting temperature second metal layer and the substrate. Any spatial arrangement of the three components can be used, as long as it promotes bonding or adhesion between the lower melting temperature second metal and the substrate (e.g., ceramic or otherwise).

Porous Wetting Substrate

Substrates

As particularly illustrated in FIGS. 4 and 7, the disclosure provides a porous wetting substrate 110 including an underlying substrate 112 and a porous first metal layer 114 on a top or upper surface 112A of the underlying substrate 112.

The underlying substrate of the disclosure is not particularly limited. That is, the method of the disclosure is generally applicable to any substrate that is suitable for having a patterned metal layer thereupon. For example, the underlying substrate can include, but is not limited to, ceramic materials or metal materials.

In embodiments, the underlying substrate includes a ceramic material. As used herein, a "ceramic material" refers to an inorganic, non-metallic oxide, nitride, or carbide material. The ceramic material can include aluminum oxide, aluminum nitride, gallium nitride, aluminum gallium nitride, aluminum gallium indium nitride, beryllium oxide, zirconium oxide, cerium oxide, zinc oxide, silicon carbide, silicon nitride, tungsten carbide, lithium oxide, lithium carbide, lithium nitride, one or more iron oxides, lanthanum strontium manganite, lanthanum strontium cobaltite, or lanthanum strontium ferrite, doped derivatives thereof, or combinations thereof. A doped derivative can include any of the foregoing ceramic materials, for example, with up to about 5, 10, or 15 wt % of other elements or oxides added thereto.

In embodiments, the ceramic material includes one or more of aluminum oxide (alumina), aluminum nitride, gallium nitride, aluminum gallium nitride, aluminum gallium indium nitride, beryllium oxide, silicon carbide, or silicon nitride. Alumina, aluminum nitride, beryllium oxide, and silicon nitride, for example, are particularly suitable for circuit board materials, given their favorable thermal conductivity and ability to withstand and dissipate heat. Alumina with varying levels of purity can be used, as well as alumina with different dopants, such as zirconium. Alumina is a suitable substrate for near-room-temperature electronics. Ceramics, such as gallium nitride, aluminum gallium indium nitride, and silicon carbide are particularly suitable for electronics operating at high temperature, such as 250° C. to 900° C.

In embodiments, the ceramic metal includes stabilized zirconium oxide, i.e., zirconia. As used herein, the terms "stabilized zirconium oxide" and "stabilized zirconia" are used interchangeably, and refer to a ceramic material in which the crystal structure of zirconium dioxide is made stabilized at room temperature by an addition of an additional oxide material, such as up to about 10 mol. % of the additional oxide material. The stabilized zirconia can include, for example, yttrium oxide (yttria)-stabilized zirconia (YSZ), calcium oxide (calcia)-stabilized zirconia, magnesium oxide (magnesia)-stabilize zirconia, cerium oxide (ceria)-stabilized zirconia, scandium oxide (scandia)-stabilized zirconia (ScSZ), aluminum oxide (alumina)-stabilized zirconia, cerium oxide, doped cerium oxide, or combinations thereof. Common SOFC solid electrolytes include YSZ such as with 8 mol % yttria, ScSZ such as with 9 mol % Scandia, and gadolinium doped ceria (GDC).

In embodiments, the ceramic material includes one or more of lanthanum strontium manganite, lanthanum strontium cobaltite, or lanthanum strontium ferrite. These materials can be useful in SOFC electrodes.

In embodiments, the underlying substrate includes one or more of a metal material or a semiconductor material. Suitable metal and/or semiconductor materials can include, for example, stainless steel alloy and nickel-based high-temperature alloy. A metallic substrate can be useful if the second metal, such as silver, does not have very good wetting properties on the metal substrate. In embodiments, a metallic substrate can include a ceramic coating on a surface thereof, such as a stainless steel substrate with an alumina coating. The first and second metals according to the disclosure can be applied to the ceramic coating of the substrate.

Porous First Metal Layer

The porous first metal layer is not particularly limited. For example, the porous first metal layer can include a first metal, wherein the first metal includes at least one of nickel, aluminum, cobalt, iron, copper, titanium, or combinations thereof. Furthermore, the porous first metal layer can include mixtures and alloys of nickel, aluminum, cobalt, iron, copper, and/or titanium.

Some metals such as aluminum, nickel, cobalt, copper could be useful as either the first or second metal (as described in more detail, below) based on its particular melting point relative to the other metal. Examples of specific combinations of first/second metals include Ni/Ag, Fe/Ag, Co/Ag, Al/Sn, Cu/Bi, and Fe/Bi. The first metal or alloy is preferably selected for its relative slowness to oxidize, such as Ni, Co, Fe, and Co—Ni (alloy), which have some degree of oxidation resistance and a high relative melting point compared to a second metal selection. In some cases, the first/second metal combinations are selected such that the first and second metals are relatively immiscible in each other such that a bulk layer in the final structure is substantially composed of a bulk second metal layer (e.g., as an outer, top, or external layer) with only minor amounts of the first metal (e.g., up to 1, 2, 5 wt. % of a minor immiscible component in a primary component). A large portion of the first metal can remain as an interfacial layer on the underlying substrate, or positioned between the substrate and the bulk second metal layer. The interfacial layer can include portions of the porous first metal layer remaining at least partially or substantially intact as a discrete structure of the interfacial layer in which the pores have been wetted or infiltrated by the second metal material. In yet other cases the first metal could be miscible with the second metal and dissolve into the bulk second metal layer as a homogeneous component (e.g., up to 1, 2, 5, 10, 20, or 30 wt. % of a minor miscible component in a primary component). Preferably, the first metal, the second metal, and the substrate are selected based on a relative inability of the second metal to wet the substrate material in isolation, for example being characterized by wetting/contact angles of the second metal on the first metal or the substrate material individually of at least 20°, 30°, 40°, or 50° when measured in air or an inert atmosphere such as nitrogen. The porous nature of the first metal layer promotes efficient wetting by the molten second metal of both the porous first metal layer and the first substrate.

The porous first metal layer can have a thickness ranging from about 10 nm (0.1 μm) to about 250 μm, about 2 μm to about 250 μm, about 5 μm to about 100 μm, about 5 μm to about 40 μm, about 10 μm to about 75 μm, about 10 μm to about 30 μm, or about 25 μm to about 50 μm, for example, about 10 nm, 100 nm, 250 nm, 500 nm, 750 nm, 1 μm, 2 μm, 3 μm, 5 μm, 8 μm, 10 μm, 15 μm, 20 μm, 30 μm, 40 μm, 60 μm, 75 μm, 100 μm, 125 μm, 150 μm, 175 μm, 200 μm, or 250 μm. The porous first metal layer need not have a uniform thickness, and the foregoing thickness values can represent an average thickness of the porous first metal layer and/or a range for a spatially variable local layer thickness.

The porous first metal layer can include pores ranging in size from about 5 nm (0.005 μm) to about 50 μm, about 10 nm to about 50 μm, about 1 μm to about 50 μm, about 5 μm to about 30 μm, or about 10 to about 20 μm, for example about 5 nm, 10 nm, 100 nm, 250 nm, 500 nm, 750 nm, 1 μm, 2 μm, 3 μm, 4 μm, 5 μm, 7 μm, 10 μm, 15 μm, 20 μm, 25 μm, 30 μm, 35 μm, 40 μm, 45 μm, or 50 μm. The foregoing pore size values can represent an average pore size and/or a range for distributed pore sizes throughout the porous first metal layer.

The porous first metal layer can be suitably adhered to the underlying substrate, for example by a pre-sintering process or otherwise. The disclosure provides methods of providing the porous wetting substrate including applying to the underlying substrate a layer of a first metal mixture including a first liquid formulation and first metal particles dispersed in the first liquid formulation, and pre-sintering the layer of the first metal mixture at a temperature and pressure sufficient to remove the first liquid formulation and at least partially sinter the first metal particles, thereby forming the porous first metal layer.

As provided herein, the first metal mixture can include a first liquid formulation and first metal particles. The first metal mixture is suitably in the form of a solution, thick paste, or suspension that coats the first substrate in the target area of interest. The first metal mixture can include at least about 30, 50, or 70 wt %, and/or up to 50, 70, or 90 wt % of the first metal particles. Similarly, the first metal mixture can include at least about 10, 30, or 50 wt %, and/or up to 30, 50, or 70 wt % of the liquid formulation.

The first metal particles can be of any suitable metal, as provided for the first metal layer, above.

The liquid formulation can include a liquid solvent medium, such as water, isopropanol, or any other alcohol or organic solvent. The liquid formulation can also include a liquid binder to improve green strength, such as a polymeric binder dissolved in the aforementioned solvent medium. The liquid formulation can also include a dispersant, such as a polymeric dispersant dissolved in the aforementioned solvent medium, to prevent agglomeration of the first metal particles in a stable first metal mixture. In embodiments, the first liquid formulation can include a polymeric solution. The liquid formulation can generally include any polymer binder, dispersant, resin, or other liquid vehicle. In some cases, the polymeric binder can be a curable binder such that the corresponding cured binder or resin is degradable at an intermediate temperature between its curing temperature and the pre-sintering temperature. Examples of suitable binder systems include, but are not limited to, ethylene glycol monobutyl ether, ethylene glycol, and isopropanol.

Pre-sintering generally includes subjecting the first metal mixture layer to a gradually ramping temperature that removes the liquid formulation, for example degrading, decomposing, etc. any polymer additives therein and at least partially fusing the first metal particles to form the porous first metal layer. Sintering generally includes applying heat and/or pressure at a level and time sufficient to fuse the particles of the sintering composition without substantial melting such as to liquefaction. In some alternative embodiments, the porous first metal layer can be applied not only through deposition techniques, but also by other chemical approaches, for example by coating the substrate surface with a metal oxide layer, such as NiO, which is then reduced to a corresponding metal, such as Ni, and also generates nano- or meso-scale porosity in the metal during the reduction process. In some alternative embodiments, a separate pre-sintering step (a2) before heating the second metal can be omitted, for example when the heating of the second metal is sufficient to induce sintering of the first metal mixture layer and form the porous first metal layer prior to and/or concurrently with the molten second metal.

When applied to the underlying substrate layer, the first metal mixture can have a thickness ranging from about 10 nm (0.01 μm) to about 100 μm, about 1 μm to about 100 μm, about 2 μm to about 100 μm, about 5 μm to about 90 μm, about 5 μm to about 40 μm, about 10 μm to about 75 μm, about 10 μm to about 30 μm, or about 25 μm to about 50 μm, for example, about 10 nm, 100 nm, 250 nm, 500 nm, 750 nm, 1 μm, 2 μm, 3 μm, 5 μm, 8 μm, 10 μm, 15 μm, 20 μm, 30 μm, 40 μm, 60 μm, 75 μm, or 100 μm. The first metal mixture need not have a uniform thickness, and the foregoing thickness values can represent an average thickness of the first metal mixture and/or a range for a spatially variable local thickness.

The first metal particles can have a size ranging from 10 nm (0.01 μm) to about 50 μm, about 1 μm to about 50 μm, about 2 μm to about 50 μm, about 3 μm to about 20 μm, about 5 μm to about 40 μm, about 5 μm to about 10 μm, about 10 μm to about 30 μm, or about 20 μm to about 25 μm, for example, about 10 nm, 100 nm, 250 nm, 500 nm, 750 nm, 1 μm, 2 μm, 3 μm, 5 μm, 8 μm, 10 μm, 15 μm, 20 μm, 30 μm, 40 μm, or 50 μm. The size of the particles can be determined via a number-, mass-, or volume-average particle size or diameter. The first metal particles need not have a uniform size, and the foregoing size values can represent an average size of the first metal particles and/or a range for spatially variable first metal particles. For example, the foregoing size ranges for the first metal particles can represent a D10 to D90 span in the cumulative size distribution function.

In embodiments, the porous first metal layer has a thickness ranging from 1 to 10 times, 1.5 to 5 times, 2 to 5 times, 2 to 8 times, 3 to 7 times, 4 to 5 times, or 5 to 8 times the average particle size of the first metal particles prior to the pre-sintering step. This thickness can be determined relative to the number-, mass-, or volume-average particle size or diameter of the first metal particles as added to the first metal mixture.

In embodiments, the pre-sintering step can include heating the layer of the first metal mixture to a maximum temperature ranging from about 600° C. to about 1400° C., about 750° C. to about 1250° C., about 800° C. to about 1100° C., or about 900° C. to about 1000° C., for example, about 600° C., 700° C., 750° C., 800° C., 850° C., 900° C., 950° C., 1000° C., 1100° C., 1200° C., 1300° C., or 1400° C. Alternatively or additionally, pre-sintering heating can include heating to a maximum temperature that is at least 100, 200, or 300° C., and/or up to 300, 500, or 700° C. lower than the first metal melting point, such as by ramping from ambient room temperature of first metal mixture application at a rate of about 2-10, 50, or 100° C./minute up to the maximum temperature, optionally holding at the maximum temperature for up to 0.1-5 hours, and then reducing the temperature back to ambient/room temperature at a rate of about 2-10, 50, or 100° C./minute. Pre-sintering is performed at a temperature sufficient to eliminate the liquid formulation through evaporation of the solvent and/or decomposition or elimination of any polymeric additives, but less than a temperature sufficient to fully sinter the first metal. At such temperatures, partial sintering/fusing of some particles can occur to a degree sufficient to provide a porous first metal structure even in the absence of polymeric additives.

In embodiments, the pre-sintering can occur in a protective pre-sintering atmosphere. The protective pre-sintering atmosphere can be any inert or protective atmosphere that avoids or prevents oxidation of the first metal particles during pre-sintering. Suitable protective pre-sintering atmospheres can include, for example, an atmosphere including at least one of argon or nitrogen. The protective pre-sintering atmosphere can be essentially completely inert gases such as argon, nitrogen, or a mixture thereof, such as at least 90, 95, 98, 99, or 99.9 mol. % inert gases. A reducing gas such as hydrogen can be included in the protective atmosphere to protect against oxidation, such as at least 1 or 2 mol. % and/or up to 5 or 10 mol. % reducing gas. The protective atmosphere is generally at a pressure of about 1 atm or slightly higher to limit entry of external air during pre-sintering. The partial pressure of oxygen gas ($pO_2$) in the protective atmosphere is generally selected to maintain a metallic surface on the first metal particles and porous layer, which can vary with the particular type of first metal, but is suitably about $10^{-6}$ atm or less in many cases.

Patterned Second Metal Material

As particularly illustrated in FIGS. 4 and 7, the methods described herein further include applying a patterned second metal material 120 to the porous wetting substrate 110 and in contact with the porous first metal layer 114 thereon. In embodiments, applying the patterned second metal material 120 includes applying to the porous wetting substrate a patterned layer of a second metal mixture 120A including a second liquid formulation and second metal particles dispersed in the second liquid formulation. In other embodiments, applying the patterned second metal material 120 includes applying a second metal material 120B such as foil or other solid form of the second metal to the porous wetting substrate 110 and in contact with the patterned porous first metal layer 114 thereon. Subsequent heating and melting of the second metal material 120B can cause the second metal to assume the patterned second metal material 120 form as a complement to the underlying porous first metal layer 114 with its corresponding pattern.

The second metal mixture is suitably in the form of a solution, thick paste, or suspension that coats the porous wetting substrate in the target area of interest. The second metal mixture can be applied on the porous wetting substrate, for example, via a printing process, such as the application of a liquid or semi-liquid second metal mixture with a print head in fluid communication with a reservoir of the second metal mixture, in a preselected or predetermined, controlled pattern. Other methods of applying a patterned second metal material can include tape-casting, deposition, mask coating, and 3D printing.

The second metal mixture can include at least 30, 50, or 70 wt % and/or up to 50, 70, or 90 wt % second metal particles. Similarly, the second metal mixture can include at least 10, 30, or 50 wt % and/or up to 30, 50, or 70 wt % second liquid formulation.

The second metal material is not particularly limited. For example, the second metal material can include a second metal, wherein the second metal includes at least one of silver, aluminum, tin, bismuth, nickel, copper, gold, cobalt, or combinations thereof. Furthermore, the second metal material can include mixtures and alloys of silver, aluminum, tin, bismuth, nickel, copper, gold, and/or cobalt.

As provided herein, the second metal has a lower melting point that that of the first metal. For example, the second metal melting point is at least 25° C., 50° C., 100° C., 200° C., or 300° C. lower and/or up to 300° C., 500° C., 700° C., or 1000° C. lower than that of the first metal. Similarly, the second metal melting point is suitably lower than the melting or thermal decomposition points of the underlying substrate.

The second liquid formulation can include a liquid solvent medium such as water, isopropanol, or other alcohol or organic solvent. The second liquid formulation can also include a liquid binder to improve green strength, such as a polymeric binder dissolved in the aforementioned solvent medium. The second liquid formulation can also include a dispersant such as a polymeric dispersant dissolved in the aforementioned solvent medium, to prevent the agglomeration of the second metal particles in a stable second metal mixture.

In embodiments, the second liquid formulation includes a polymeric solution. The second liquid formulation can generally include any polymeric binder, dispersant, resin, or other liquid vehicle. In some cases, the polymeric binder can be a curable binder such that the corresponding cured binder or resin is degradable at an intermediate temperature between its curing temperature and the heating/melting temperature of the second metal material. An example binder system includes ethylene glycol monobutyl ether, ethylene glycol, and isopropanol.

In embodiments, the second metal mixture layer has a thickness ranging from about 10 nm (0.01 µm) to about 500 µm, about 2 µm to about 500 µm, about 2 µm to about 400 µm, about 5 µm to about 250 µm, about 5 µm to about 40 µm, about 10 µm to about 100 µm, about 10 µm to about 30 µm, or about 25 µm to about 50 µm, for example, about 10 nm, 100 nm, 250 nm, 500 nm, 750 nm, 1 µm, 2 µm, 3 µm, 5 µm, 8 µm, 10 µm, 15 µm, 20 µm, 30 µm, 40 µm, 60 µm, 75 µm, 100 µm, 125 µm, 150 µm, 175 µm, 200 µm, 250 µm, 300 µm, 400 µm, or 500 µm. The second metal mixture need not have a uniform thickness, and the foregoing thickness values can represent an average thickness of the second metal mixture and/or a range for a spatially variable local thickness. The second metal mixture can be comparable, but generally larger in thickness, relative to that of the eventual patterned, wetted second metal layer.

In embodiments, the second metal particles have a size ranging from about 10 nm to about 50 µm, about 1 µm to about 50 µm, about 2 µm to about 50 µm, about 3 µm to about 20 µm, about 5 µm to about 40 µm, about 5 µm to about 10 µm, about 10 µm to about 30 µm, or about 20 µm to about 25 µm, for example, about 10 nm, 100 nm, 250 nm, 500 nm, 750 nm, 1 µm, 2 µm, 3 µm, 5 µm, 8 µm, 10 µm, 15 µm, 20 µm, 30 µm, 40 µm, or 50 µm. The size of the particles can be determined via a number-, mass-, or volume-average particle size or diameter. The second metal particles need not have a uniform size, and the foregoing size values can represent an average size of the second metal particles and/or a range for spatially variable second metal particles. For example, the foregoing size ranges for the second metal particles can represent a D10 to D90 span in the cumulative size distribution function.

In embodiments, the second metal mixture layer has a thickness ranging from 1 to 10 times, 1.5 to 5 times, 2 to 5 times, 2 to 8 times, 3 to 7 times, 4 to 5 times, or 5 to 8 times the average particle size of the second metal particles prior to heating. This thickness can be determined relative to the number-, mass-, or volume-average particle size or diameter of the second metal particles as added to the second metal mixture.

In embodiments, applying the second patterned second material metal includes (a1) applying to the underlying substrate a patterned layer of a first metal mixture including a first liquid formulation and first metal particles dispersed in the first liquid formulation; (a2) pre-sintering the patterned layer of the first metal mixture at a temperature and pressure sufficient to remove the first liquid formulation and at least partially sinter the first metal particles, thereby forming a patterned porous first metal layer; (b1) applying the second metal material to the porous wetting substrate and in contact with the patterned porous first metal layer thereon; and (c1) heating the second metal at a temperature and pressure sufficient to melt the second metal material, wet pores of the patterned porous first metal layer with the molten second metal material, and contact the underlying substrate with the molten second metal material, thereby forming a wetted substrate including the underlying substrate, and a patterned, wetted second metal layer adhered to the underlying substrate with a pattern corresponding to that of the patterned porous first metal layer.

The heating temperature is suitably sufficiently high to melt the second metal material, but far enough below the melting point of the first metal, such that the porous first metal layer does not melt or otherwise disintegrate before its porous structure promotes the wetting and contact of the underlying substrate with the molten second metal material. The final, solid patterned second metal layer forms after cooling of the wetted substrate, wherein the second metal material is still in liquid form, for example by returning to ambient temperature and pressure conditions without elevated heating temperature and/or an inert protective atmosphere.

In embodiments, the heating of the second metal includes heating the second metal to a maximum temperature ranging from about 600° C. to about 1200° C., about 750° C. to about 1100° C., about 800° C. to about 1000° C., or about 900° C. to about 950° C., for example, about 600° C., 700° C., 750° C., 800° C., 850° C., 900° C., 950° C., 1000° C., 1100° C., or 1200° C. Alternatively or additionally, heating can include heating to a maximum temperature that is at least 100, 200, or 300° C. lower and/or up to 300, 500, or 700° C. lower than the first metal melting point, such as by ramping from ambient room temperature of first metal mixture application at a rate of about 2-10, 50, or 100° C./minute up to the maximum temperature, optionally holding at the maximum temperature for up to 0.1-5 hours, and then reducing the temperature back to ambient/room temperature at a rate of about 2-10, 50, or 100° C./minute. The heating process is performed at a temperature and pressure sufficient to melt the second metal material. The molten second metal material then wets the pores of the porous first metal layer to penetrate the first metal layer pores and contact the underlying substrate with controlled and/or limited, lateral spreading such that the molten second metal material retains substantially the same two-dimensional spatial pattern of the patterned second metal material as applied to the porous wetting substrate. The result of the heating process is a wetted substrate including the substrate and a patterned, wetted second metal layer adhered thereto. Heating generally includes subjecting the second metal to a gradually ramping temperature that removes the second liquid formulation, when present, by degrading, evaporating, or decomposing any polymer additives or solvents therein, and melting the second metal particles to form the molten second metal and patterned, wetted second metal layer.

In embodiments, the heating of the second metal can occur in a protective atmosphere. The protective atmosphere can be any inert or protective atmosphere that avoids or prevents oxidation of the second metal particles during heating. Suitable protective atmospheres can include, for example, an atmosphere including at least one of argon or nitrogen. The protective pre-sintering atmosphere can be essentially completely inert gases such as argon, nitrogen, or a mixture thereof, such as at least 90, 95, 98, 99, or 99.9 mol. % inert gases. A reducing gas such as hydrogen can be included in the protective atmosphere to protect against oxidation, such as at least 1 or 2 mol. % and/or up to 5 or 10 mol. % reducing gas. The protective atmosphere is generally at a pressure of about 1 atm or slightly higher to limit entry of external air during heating. The partial pressure of oxygen gas ($pO_2$) in the protective atmosphere is generally selected to maintain a metallic surface on the first and second metal particles and porous layer, which can vary with the particular type of first metal, but is suitably about $10^{-6}$ atm or less in many cases.

In embodiments, the second metal material includes at least about 90 wt % of the second metal, for example at least about 90 wt %, 95 wt %, 98 wt %, 99 wt %, or 99.9 wt % of the second metal, with the balance being other alloy or impurity elements.

In embodiments, the second metal material is free from air-reactive components. For example, the second metal material can be free from oxygen-reactive components such as reducible or oxidazable species, such as copper, indium, zirconium, titanium, zinc, tin, manganese, lithium, and/or silicon, and further including species containing the foregoing elements. For example, the second metal material can be free of copper-containing species such as CuO.

Patterned, Wetted Substrate

As particularly illustrated in FIGS. 4 and 7, the patterned second metal layer 124 generally can include at least one or two portions: a bulk second metal layer 126 and, optionally, an interfacial layer 118 between the bulk second metal layer 126 and the substrate 112. Both the bulk second metal layer 126 and the interfacial layer 118, when present, generally share the same shape or pattern as the patterned second metal layer 124. For example, provided herein are patterned, wetted substrates 100 prepared according to the methods described herein. The patterned, wetted substrates 100 include a substrate 112, the bulk patterned second metal layer 124 adjacent to the substrate 112, and (optionally) the interfacial layer 118 between the bulk patterned second metal layer 124 and the substrate 112. The bulk second metal layer 124 includes the second metal and optionally the first metal. The first metal, when present in the bulk second metal layer 124, is at a lower concentration than the second metal. The interfacial layer 118 includes the first metal. Each of the substrate(s), metal(s) and/or metal layer(s) in the patterned, wetted substrate can be prepared and/or selected as described, above.

In embodiments, the patterned, wetted substrate also includes one or more electronic components 200 mounted to the patterned, wetted substrate 110 in electrical connection to an element of the bulk patterned second metal layer 126, for example where the bulk patterned second metal layer 126 has a spatial pattern corresponding to electronic circuitry. Two or more electronic components can also be interconnected with each other via one or more second metal pattern elements.

The bulk patterned second metal layer, that is, the outer, top, or external layer, generally includes only minor amounts of the first metal. In embodiments, the bulk patterned second metal layer of the patterned, wetted substrate has a first metal concentration of 20 wt % or less and the interfacial layer has a first metal concentration that is at least 10 wt % and greater than the first metal concentration of the bulk patterned second metal layer. For example, the bulk patterned second metal layer can include at least 0.1, 1, or 2 wt % and/or up to 1, 2, 5, 10, 15, or 20 wt % of the first metal, where the concentration can represent an average concentration across the bulk second metal layer and/or a range spanning/including the local maximum and minimum concentration across the bulk second layer. Similarly, the interfacial layer can include, for example, at least 10, 15, 20, 30, 40, 50, 60, 80, 90, or 95 wt. % first metal, where the concentration can represent an average concentration across the interfacial layer and/or a range spanning/including the local maximum and minimum concentration across the diffusion layer. Relative high/low concentrations of the first metal in the interfacial layer and the bulk patterned second metal layer can be based on the average first metal values in the corresponding layers.

A large portion of the first metal can remain as an interfacial layer on the substrate, positioned between the substrate and the bulk second metal layer. The interfacial layer can include portions of the porous first metal layer remaining at least partially or substantially intact as a discrete structure of the interfacial layer in which the pores have been wetter or infiltrated by the second metal material. As a result of the initially patterned first porous metal layer, the interfacial layer can have the same pattern corresponding to that of the bulk patterned second metal layer.

In embodiments, the bulk patterned second metal layer has a second metal concentration ranging from about 70 wt % to about 99 wt %, about 75 wt % to about 95 wt %, or about 80 wt % to about 90 wt %, for example, about 70 wt %, 75 wt %, 80 wt %, 85 wt %, 90 wt %, 95 wt %, 98 wt %, or 99 wt %.

In embodiments, the bulk patterned second metal layer is substantially free from discrete first metal particles having a size greater than 1 μm. As used herein, "substantially free," means that the bulk patterned second metal layer suitably contains less than about 1 wt %, 0.5 wt %, 0.1 wt %, or 0.01 wt % of discrete first metal particles having a size greater than 1 μm. For example, the original porous first metal layer formed during fabrication can essentially be completely disintegrated. The first metal present in the bulk second metal layer can be in the form of a continuous mixture or alloy with the second metal and not as discrete larger first metal particles such as those originally used to form the porous first metal layer. Alternatively or additionally, first metal present in the bulk second metal layer can be present in sub-micron sized discrete particles from the porous first metal layer that were not completely disintegrated during heating, such as less than 1000, 500, 200, 100, or 10 nm in size whether on average or for the entire distribution.

Electronic Apparatus and Component

Further provided herein is an electronic apparatus 200 and methods for forming the same. The electronic apparatus 200 includes an electronic component 210 and patterned, wetted substrate 100 in electrical connection therewith, for example via the patterned, wetted second metal layer 124 thereof. A suitable method of making the apparatus includes performing a method as provided herein according to any of its various embodiments to form the patterned, wetted substrate 100, including the underlying substrate 112, and the patterned, wetted second metal layer 124 adhered thereto. The patterned second metal material 124 has a spatial pattern corresponding to electronic circuitry. One or more electronic components 210 are then mounted to the patterned, wetted substrate 100 in electrical connection to an element of the patterned, wetted second metal layer 124, thereby providing the apparatus 200.

Two or more electrical components can also be interconnected with each other via one or more second metal pattern elements. The electronic components and/or integrated electronic systems suitable for manufacture and use as a high-temperature PCB are not particularly limited. Suitable examples include industries that need higher-frequency connections and good heat resistance that can benefit from ceramic PCBs, for example, automotive components, aerospace components, medical device components, heavy machinery components, monitors for drilling equipment and related components, sensors in heat engines of any kind, RF resistors and terminations, and LED chips.

EXAMPLES

The following examples illustrate methods and articles according to the disclosure, but are not intended to limit the scope of any of the claims thereto.

Nickel and silver pastes were produced by hand-mixing 99.9% pure, −400 mesh (<37 μm) sized nickel powder (Alfa Aesar Inc.) or 99.9% pure, −325 mesh (<44 μm) sized silver powder (Alfa Aesar Inc.) with a V-737 organic vehicle (Hereaus, Inc.) in a 2:1 ratio by weight. The pastes were applied to substrates according to either route A or B, as generally illustrated in FIG. 7. For both routes, the nickel paste was first screen-printed onto different ceramic substrates with a designed pattern (e.g., a grid pattern, a circuit-like line pattern) and a variable number of printing/coating passes to control the thickness of the nickel layer to have a desired value. Two and three printing passes of nickel paste were used for route A and B, respectively. Samples were dried at 120° C. for 10 minutes after each printing pass. Subsequently, for route A, a similar screen-printing and drying process was repeated with the silver paste to achieve a desired layer thickness (six passes total) on top of the nickel paste-printed substrates, with the silver paste layer having generally the same pattern as the underlying nickel layer. For route B, a piece of 99.95% pure silver (Alfa Aesar Inc.) with a weight of ~5 mg was placed atop the nickel paste-printed substrates. Finally, the assemblies in both cases were heated and held at a temperature of 820° C. for 2 hours to remove the organic vehicle (e.g., solvent and/or polymer components thereof) as well as to partially sinter the nickel powders, thereby forming a porous nickel layer on the substrate. The assemblies were then heated and held at a temperature of 1000° C. for 30 minutes to allow the silver to melt and spontaneously infiltrate the partially-sintered, porous nickel layer. A ramp rate of 5° C./min was used for both heating and cooling, and the entire process was performed in 20 sccm of flowing Ar to prevent nickel oxidation.

Both routes A and B can be used to have provide a patterned liquid silver layer in a controlled shape and at a designated location on various ceramic substrates, which in turn solidifies upon cooling to provide a patterned silver layer that wets and is adhered to the underlying ceramic substrate.

FIG. 5 shows top-view optical images of a silver circuit with a complicated, circuit-like line pattern or design on an alumina ($Al_2O_3$) substrate in different manufacturing stages using route A. This illustrates circuit-like line patterns that can be incorporated into electronic components such as high power and/or high temperature circuits and electronics that use ceramic boards. As shown in FIG. 5, panel A, the silver and nickel material were deposited onto the $Al_2O_3$ substrate with a predesigned (decorative) circuit pattern. The typical line width and height as printed are ~540 μm and ~80 μm, respectively. After heating above the melting point of silver, it is shown in FIG. 5, panel B that the nickel powder had partially sintered into a porous layer and remained adjacent to the ceramic substrate (e.g., as an interfacial layer between the substrate and top silver layer), whereas the silver remained within an upper, bulk surface region consisting primarily of silver and covering the underlying porous nickel coverage. The overall line width and height remained the same as described above relative to panel A, with the silver and nickel materials essentially retaining their original as-printed patterns. In the cross-sectional back-scattered electron (BSE) images (bottom row of each panel), some individual nickel particles can be observed floating at the top. Without intending to be bound by theory, it is believed that these are isolated particles that were not sintered into the porous nickel layer.

Similar control experiments with only six silver screen-print passes and no nickel passes were also performed. Due to the lack of a porous nickel or other underlying metal and due to the poor wetting characteristics of silver on the ceramic substrate, the silver powder melted and balled-up into individual spheres that did not bond to the $Al_2O_3$ substrate at all or otherwise maintain its original printed pattern.

FIG. 5, panel C shows the circuit after being heated and held for 5 hours at 850° C. in air. Optically, the circuit pattern exhibited little difference in the silver portion where no delamination was observed and the line width remained unchanged, except for the contrast change on the appearance. Without intending to be bound by theory, it is thought that this was likely due to the surface oxidation of the silver. The cross-section shows similar width and height of the lines, and that the nickel network has undergone some oxidation. The darker grey contrast shows that oxidized parts of the nickel network (NiO), and the cores of some nickel particles are still not oxidized (lighter grey contrast). It is noted that the total silver footprint (i.e., the total area of direct contract between the silver and its substrate) on the $Al_2O_3$ substrate appears to have decreased somewhat. However, the majority of the silver is remains in a shape and position similar to that in FIG. 5, panel B, indicating that there remains good electrical conduction through the silver circuit lines. In general, the circuit remained dense up to 850° C. in air, which demonstrate the suitability of patterned wetted substrates according to the disclosure for use in high-temperature electronics.

FIG. 6 shows the creation of a silver grid pattern on alumina ($Al_2O_3$), aluminum nitride (AlN), yttrium oxide (yttria)-stabilized zirconia (YSZ), and silicon carbide (SiC) substrates (using route. When the desired pattern is interconnected and continuous like current collectors, the silver source material can be a bulk piece of the silver metal placed within or on a portion of an underlying nickel layer having the desired (printed) pattern (e.g., a simple square grid as illustrated). Upon initial heating to a nickel-sintering temperature as described above, the underlying nickel layer becomes a porous nickel layer. Upon further heating to a silver-melting temperature as described above, the liquid silver only occupies the silver-philic regions within the porous nickel and avoids or limits exposure to the silver-phobic regions where bare ceramic material was exposed and to which silver has poor wetting and adhesion properties. By a comparing the second and third rows in FIG. 6, it is clear that the molten silver has infiltrated the porous nickel layer and assumed the corresponding grid pattern. The patterned silver shows a close reproduction of the nickel pattern, for example exhibiting sharp edges. Likewise, grid holes at the center of the pattern that were originally directly under the bulk silver foil pieces (second row) are not covered by silver after infiltration (third row), illustrating a complete wicking and evacuation away from the areas not intended for silver pattern coverage. The bottom row in FIG. 6 show the cross-sectional BSE images of the silver-nickel on different substrates. The microstructure shows partially sintered nickel network (grey contrast) with fully infiltrated silver (light grey contrast) and is very similar to that in FIG. 5. This method can be used to produce dense current collectors on various ceramic electrodes with well-defined geometries.

Several nickel powders with different particle sizes were investigated for wetting and spreading characteristics of silver on YSZ|NiO-YSZ substrates. For these example, a porous nickel network prepared as described using a nickel paste that was sintering at about 800° C. for 2 hours. As generally described above according to route B, a piece of silver was then placed on top of the porous nickel network and melted at about 1000° C. An observation of top-down infiltration indicates that the molten silver infiltrated the portion of the porous nickel directly underneath the silver piece. An observation of spreading within the nickel network indicates the molten silver infiltrated and spread across the entire porous nickel network. For nickel powders of −400 mesh (<37 μm pass) size and −325 mesh (<44 μm pass) size, both top-down infiltration and spreading within the porous nickel network were observed, suggesting that the porous nickel network was sufficiently strong (e.g., as characterized by bonding strength between sintered nickel particles, and the mass of the nickel particles) to withstand surface tension and other straining forces, for example at the infiltration front of the molten silver, to allow infiltration and spreading throughout the nickel network. For smaller nickel powders having a an average size in a range of 3-7 μm, top-down infiltration was observed, but not spreading within the porous nickel network. In such cases, the molten silver broke the nickel network by pulling in nickel particles and then balling-up. Contrary to the previous example with larger nickel particle sizes, this suggested that the smaller nickel particles created a relatively weak porous nickel network. Nonetheless, observation of top-down infiltration indicates that the smaller nickel particles could be suitable in cases where a corresponding patterned silver layer is applied atop the underlying patterned nickel layer, in which case top-down infiltration is the primary means for wetting and pore-filling (i.e., in contrast to placing an unpatterned silver foil or other bulk solid which requires spreading throughout the porous network).

Accordingly, the examples demonstrate that the methods according to the disclosure provide control of wetting and spreading of liquid silver on various ceramic substrates. It was demonstrated that dense silver layers were obtained in different shapes and/or designs on alumina, aluminum nitride and yttria-stabilized-zirconia substrates.

Because other modifications and changes varied to fit particular operating requirements and environments will be apparent to those skilled in the art, the disclosure is not considered limited to the example chosen for purposes of illustration, and covers all changes and modifications which do not constitute departures from the true spirit and scope of this disclosure.

Accordingly, the foregoing description is given for clearness of understanding only, and no unnecessary limitations should be understood therefrom, as modifications within the scope of the disclosure may be apparent to those having ordinary skill in the art.

All patents, patent applications, government publications, government regulations, and literature references cited in this specification are hereby incorporated herein by reference in their entirety. In case of conflict, the present description, including definitions, will control.

Throughout the specification, where the compounds, compositions, articles, methods, and processes are described as including components, steps, or materials, it is contemplated that the compositions, processes, or apparatus can also comprise, consist essentially of, or consist of, any combination of the recited components or materials, unless described otherwise. Component concentrations can be expressed in terms of weight concentrations, unless specifically indicated otherwise. Combinations of components are contemplated to include homogeneous and/or heterogeneous mixtures, as would be understood by a person of ordinary skill in the art in view of the foregoing disclosure, and following examples.

PARTS LIST 100 patterned, wetted substrate
110 porous wetting substrate
112 (underlying) substrate
112A top or wetted substrate surface
114 (patterned) porous first metal layer
114A first metal mixture/layer
116 pores of first metal layer
118 interfacial layer
120 (patterned) second metal material
120A second metal material in paste or liquid formulation
120B second metal material in metal foil or other solid form
122 molten second metal material
124 patterned, wetted second metal layer
126 bulk (patterned) second metal layer
130 wetted substrate
200 electronic apparatus
210 electronic component

What is claimed is:

1. A patterned, wetted substrate comprising:
(a) a substrate;
(b) a bulk patterned second metal layer adjacent to the substrate, the bulk patterned second metal layer comprising a second metal and a first metal, the first metal being at a lower concentration than the second metal in the bulk patterned second metal layer; and
(c) an interfacial layer between the bulk patterned second metal layer and the substrate, the interfacial layer comprising the first metal and the second metal;
wherein:
the second metal has a lower melting point than that of the first metal;
the interfacial layer comprises porous portions of the first metal defining pores therein, the pores ranging in size from 0.005 μm to 50 μm;
the pores of the porous portions contain the second metal infiltrated therein, the second metal infiltrated in the pores ranging in size from 0.005 μm to 50 μm;

the second metal is bonded to and is in contact with the substrate via the porous portions of the first metal in the interfacial layer;

the interfacial layer has a thickness in a range of 0.01 µm to 250 µm; and the bulk patterned second metal layer and the interfacial layer have a combined thickness in a range of 0.1 µm to 1000 µm.

2. The patterned, wetted substrate of claim 1, further comprising one or more electronic components mounted to the patterned, wetted substrate in electrical connection to an element of the bulk patterned second metal layer;

wherein the bulk patterned second metal layer has a spatial pattern corresponding to electronic circuitry, and the interfacial layer has the same spatial pattern as the bulk patterned second metal layer.

3. The patterned, wetted substrate of claim 1, wherein the bulk patterned second metal layer has a first metal concentration of 20 wt. % or less; and the interfacial layer has a first metal concentration of at least 10 wt. % and greater than the first metal concentration of the bulk patterned second metal layer.

4. The patterned, wetted substrate of claim 1, wherein the bulk patterned second metal layer has a second metal concentration ranging from 70 wt. % to 99 wt. %.

5. The patterned, wetted substrate of claim 1, wherein the bulk patterned second metal layer is free from discrete first metal particles having a size greater than 1 µm.

6. The patterned, wetted substrate of claim 1, wherein:
the first metal comprises at least one of nickel, aluminum, cobalt, iron, copper, titanium and combinations thereof; and the second metal comprises at least one of silver, aluminum, tin, bismuth, nickel, copper, gold, cobalt, and combinations thereof.

7. The patterned, wetted substrate of claim 1, wherein the second metal comprises silver.

8. The patterned, wetted substrate of claim 1, wherein: the substrate comprises a ceramic material.

9. The patterned, wetted substrate of claim 8, wherein the ceramic material is selected from the group consisting of aluminum oxide, aluminum nitride, gallium nitride, aluminum gallium nitride, beryllium oxide, zirconium oxide, cerium oxide, zinc oxide, silicon carbide, silicon nitride, tungsten carbide, doped derivatives thereof, and combinations thereof.

10. The patterned, wetted substrate of claim 8, wherein the ceramic material comprises one or more of aluminum oxide (alumina), aluminum nitride, gallium nitride, aluminum gallium nitride, aluminum gallium indium nitride, beryllium oxide, silicon carbide and silicon nitride.

11. The patterned, wetted substrate of claim 8, wherein the ceramic material comprises a stabilized zirconium oxide (zirconia).

12. The patterned, wetted substrate of claim 8, wherein the ceramic material comprises one or more of lanthanum strontrium manganite, lanthanum strontium cobaltite, and lanthanum strontium ferrite.

13. The patterned, wetted substrate of claim 1, wherein the substrate comprises one or more of a metal material and a semiconductor material.

14. The patterned, wetted substrate of claim 1, wherein the substrate comprises a stainless steel alloy.

15. The patterned, wetted substrate of claim 1, wherein the substrate comprises a nickel-based high temperature alloy.

16. The patterned, wetted substrate of claim 1, wherein the melting point of the second metal is lower than the melting point of the first metal by at least 300° C.

17. The patterned, wetted substrate of claim 1, wherein the melting point of the second metal is lower than the melting point of the first metal by 300° C. to 700° C.

18. The patterned, wetted substrate of claim 1, wherein the melting point of the second metal is lower than the melting point of the first metal by 700° C. to 1000° C.

19. The patterned, wetted substrate of claim 1, wherein:
the bulk patterned second metal layer has a first metal concentration of 20 wt. % or less;

the interfacial layer has a first metal concentration of at least 10 wt. % and greater than the first metal concentration of the bulk patterned second metal layer;

the bulk patterned second metal layer has a second metal concentration ranging from 70 wt. % to 99 wt. %;

the first metal comprises at least one of nickel, aluminum, cobalt, iron, copper, titanium and combinations thereof; and the second metal comprises at least one of silver, aluminum, tin, bismuth, nickel, copper, gold, cobalt, and combinations thereof.

20. The patterned, wetted substrate of claim 19, wherein the melting point of the second metal is lower than the melting point of the first metal by 300° C. to 1000° C.

* * * * *